United States Patent
Nagai et al.

(10) Patent No.: US 7,608,825 B2
(45) Date of Patent: Oct. 27, 2009

(54) IMAGE PICKUP DEVICE, VISION ENHANCEMENT APPARATUS, NIGHT-VISION APPARATUS, NAVIGATION SUPPORT APPARATUS, AND MONITORING APPARATUS

(75) Inventors: Youichi Nagai, Osaka (JP); Yasuhiro Iguchi, Osaka (JP); Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/954,617

(22) Filed: Dec. 12, 2007

(65) Prior Publication Data

US 2008/0142714 A1 Jun. 19, 2008

(30) Foreign Application Priority Data

Dec. 14, 2006 (JP) .............................. 2006-337668

(51) Int. Cl.
*G01J 5/20* (2006.01)

(52) U.S. Cl. .................... 250/338.4; 250/332; 257/188; 257/189

(58) Field of Classification Search ........................ None
See application file for complete search history.

(56) References Cited

U.S. PATENT DOCUMENTS

| | | | | |
|---|---|---|---|---|
| 5,316,956 A | * | 5/1994 | Iwasaki et al. ................ | 438/68 |
| 5,414,439 A | * | 5/1995 | Groves et al. .................. | 345/7 |
| 5,959,339 A | * | 9/1999 | Chapman et al. ............. | 257/440 |
| 6,057,560 A | * | 5/2000 | Uchida ......................... | 257/94 |
| 6,429,789 B1 | * | 8/2002 | Kiridena et al. .............. | 340/905 |
| 2004/0257442 A1 | * | 12/2004 | Eggers et al. ................ | 348/148 |
| 2005/0169334 A1 | * | 8/2005 | Sato ............................. | 372/45 |
| 2007/0096648 A1 | * | 5/2007 | Nakajima et al. ............ | 313/542 |
| 2008/0046150 A1 | * | 2/2008 | Breed .......................... | 701/45 |

FOREIGN PATENT DOCUMENTS

| JP | 07-302928 | 11/1995 |
|---|---|---|
| JP | 09-37147 | 2/1997 |
| JP | 2002-274258 | 9/2002 |
| JP | 2002-373999 | 12/2002 |
| JP | 2004-350229 | 12/2004 |

OTHER PUBLICATIONS

Bouzid et al., "Photocurrent spectroscopy of GaInNAs and GaIn-NAs(Sb) strained quantum wells grown by molecular beam epitaxy", Sensors and Actuators A Physical; Elsevier, vol. 113, pp. 365-369; published Apr. 21, 2004.*

Vatsia, M., "Atmospheric Optical Environment," Research and Dev't. Tech. Report ECOM-7023 (1972).

Cohen et al., "Near-IR imaging cameras operate at room temperature," (Sensors Unlimited) Laser Focus World p. 109 (1993).

* cited by examiner

*Primary Examiner*—David P Porta
*Assistant Examiner*—Yara B Green
(74) *Attorney, Agent, or Firm*—Fish & Richardson P.C.

(57) ABSTRACT

There is provided an image pickup device which picks up an image of an object by absorbing light in a near infrared region reflected from the object and which has semiconductor photodetectors including an absorption layer of a bandgap wavelength in the range of 1.65 to 3.0 μm.

17 Claims, 14 Drawing Sheets

IMAGE PICKUP DEVICE, VISION ENHANCEMENT APPARATUS, NIGHT-VISION APPARATUS, NAVIGATION SUPPORT APPARATUS, AND MONITORING APPARATUS

BACKGROUND OF THE INVENTION

1. Field of the Invention

The present invention relates to an image pickup device having a sensitivity wavelength range which includes near infrared wavelengths (short wavelength infrared (SWIR)), that is, night glow, among electromagnetic waves coming to the earth from the universe, and also relates to a vision enhancement apparatus, a night-vision apparatus, a navigation supporting device, and a monitoring apparatus, each of which uses the image pickup apparatus described above.

2. Description of the Background Art (I) Night glow: Various types of electromagnetic waves (light) have come to the earth from the universe, and for example, radio astronomy that studies the form of the universe by observing x-rays coming from the universe has been well known. Among the electromagnetic waves coming to the earth from the universe, since the detection of the SWIR band does not require a large and expensive apparatus, intensive attention has been paid to the SWIR band in recent years, and many reports thereon have been published. For example, there has been a report in which observation results of the SWIR spectrum coming from the universe are described, and in which a spectrum having a peak at a wavelength between 1.4 to 1.9 µm is disclosed (Vatsia, Mirshri, L. "Atmospheric Optical Environment", Research and Development Technical Report ECOM-7023, September (1972)). In addition, for example, a night-vision device using an InGaAs photodetector (In atom:Ga atom=0.53:0.47) lattice-matched with InP has been disclosed (Marchall J. Cohen, "Near-IR imaging cameras operate at room temperature", LASER FOCUS WORLD, June 1993, p. 109 (Seniors Unlimited)). In this case, as shown in FIG. 24, an atomic ratio In/Ga is set to 0.53/0.47 in order to enable the lattice parameter to match with that of an InP substrate, and hence the sensing limit (threshold sensitivity) of the photodetector at a long wavelength side is approximately 1.7 µm. The structure of the photodetector shown in FIG. 24 will be particularly described in a comparative example. Hereinafter, light in the SWIR band which has come to the earth from the universe is called the night glow or the night glow in the SWIR band, or is simply called the SWIR band light.

(II) Compound semiconductor photodetector: In order to detect light having a wavelength longer than that detected by the above InGaAs photodetector (absorbable wavelength at a long wavelength side is not so long), a photodetector has been proposed as shown in FIG. 25 in which a graded layer having a graded composition or a step buffering layer is provided on InP for lattice matching, and the In composition is gradually increased while the lattice matching is maintained (Japanese Unexamined Patent Application Publication No. 2002-373999). In this case, since the atomic ratio In/Ga is set larger than that described above, the lattice parameter is gradually increased from an InP substrata to an absorption layer, and hence the sensitivity of the absorption layer (In/Ga=0.8/0.2) is enhanced to a longer wavelength side. The structure of the photodetector shown in FIG. 25 will also be particularly described in a comparative example.

(III) Night-vision apparatus: In recent years, a night-vision apparatus using light in a long wavelength region has also been proposed although it is not directly related to the technique described above. For example, there have been proposed an apparatus supporting vision enhancement of a backward field of view of an automobile, in which by irradiating an object including a person with infrared light, reflection thereof is picked up by an infrared camera (Japanese Unexamined Patent Application Publication No. 2004-350228); an automobile night-vision apparatus configured in combination of near infrared light-emitting diodes (LED) and an image pickup device, which is similar to the device described above (Japanese Unexamined Patent Application Publication No. 2002-274258); a vision device configured in combination of two wavelength regions, that is, infrared and near infrared regions (Japanese Unexamined Patent Application Publication No. 9-37147); and an in-vehicle image pickup device which absorbs light in a 1.5 µm band using InGaAs photodetectors (Japanese Unexamined Patent Application Publication No. 7-302928).

Problems of the techniques described above may be summarized as follows.

(A1) Compound semiconductor photodetector: Since noise and dark current are large, and in addition, many dark spots are present, a clear image cannot be obtained. In particular, as the temperature is increased, the image definition is considerably degraded.

(A2) Night-vision apparatus: A light source of infrared, near infrared, or the like is necessary. In addition, the device is complicated, and as a result, the cost thereof is increased. Furthermore, the image definition is not sufficient.

The problems of the above (A1) occur since a compound semiconductor which can absorb light in a longer wavelength region cannot be well formed to have good crystal quality. In addition, since having serious influences on social and economical situations, the problems of the above (A2) must be urgently solved. The present invention first overcomes the problems of the above (A2), that is, the present invention provides an image pickup device and a vision enhancement apparatus, which can obtain a clear image, although having a simple structure. Furthermore, the present invention provides an image pickup device having an absorption layer, which solves the problems of the above (A1), that is, which can reliably obtain a clear image while the noise and dark current are reduced, and in addition to that, by using this image pickup device, the present invention provides a vision enhancement apparatus, a night-vision apparatus, a navigation supporting apparatus, and a monitoring apparatus. In general, it is roughly classified such that the vision enhancement device is an device mounted in a vehicle (an automobile or the like) to enhance a field of view of a driver for safety improvement; the night-vision apparatus is a person-portable apparatus; the navigation supporting apparatus is an apparatus which is mounted in a vessel and which supports recognition of an object by some sort of means; and the monitoring apparatus is an apparatus placed at a predetermined position to monitor an object; however, the classification described above is not strict. Accordingly, the vision enhancement apparatus, the night-vision apparatus, the navigation supporting apparatus, and the monitoring apparatus can all be regarded as an apparatus including an optical device to which the above image pickup device is applied.

SUMMARY OF THE INVENTION

An image pickup device of the present invention is an image pickup device which picks up an image of an object by absorbing light in a near infrared region reflected from the object. This image pickup device comprises semiconductor photodetectors which includes an absorption layer having a bandgap wavelength in the range of 1.65 to 3.0 µm.

According to the structure described above, since the object is picked up by absorbing night glow, which has a peak at a wavelength between 1.4 to 1.9 µm, reflected from the object, a clear image can be obtained regardless of day and night. In addition, by the above semiconductors having a sensitivity at a wavelength of 1.65 to 3.0 µm, even under conditions of fog, smoke, or dust, the influence of an absorption peak (having a broad absorption in a wavelength region of more than 3.0 µm) in a medium wavelength infrared (MWIR) region of a water absorption spectrum can be reduced, and hence a clear image can be obtained. Furthermore, since an image can be picked up without using any auxiliary light irradiation, the probability of damaging human eyes by irradiation of light incident thereon can be fully removed. In addition, the reason the maximum wavelength is set to 3.0 µm is that even when it is attempted to form an absorption layer having a sensitivity at a wavelength of more than 3.0 µm, since the amount of N incorporated in an epitaxial film, which forms the absorption layer, during the growth thereof is limited, the quality is degraded when the amount of N is forcedly increased, and as a result, the dark current cannot be decreased to a low level.

The photodetectors described above can absorb light in a wavelength region of 1.0 to 2.0 µm. According to this structure, since reflection of night glow having a peak in the range of 1.4 to 1.9 µm can be specifically absorbed, disorder of an image caused by the water absorption spectrum or the like can be reliably overcome. That is, since the water absorption spectrum has absorption at a short and a long wavelength side, that is, at both sides at a wavelength of 3.0 µm (in particular, a broad absorption being present at the long wavelength side), when light in a wavelength region of 1.0 to 2.0 µm is absorbed as described above, the influence of the maximum peak at a wavelength of approximately 3.0 µm of the water absorption spectrum can be eliminated, and as a result, the disorder of an image which is caused by the water absorption spectrum can be suppressed. "To absorb light in a wavelength region of 1.0 to 2.0 µm" means that the photodetector has no sensitivity in a wavelength region other than that of 1.0 to 2.0 µm. This may include the case in which because of properties of a compound semiconductor forming the absorption layer, the sensitivity thereof is restricted in a wavelength region of 1.0 to 2.0 µm. In the case described above, the threshold sensitivity at a long wavelength side may be 1.5 µm or 1.7 µm. In addition, in particular, in order to realize a threshold sensitivity at a wavelength of 2.0 µm as a limit of long wavelength side, a filter which cuts light having a wavelength of more than 2.0 µm may be provided.

In addition, as the photodetector described above, a photodetector may be used which has an InP substrate and an absorption layer which is formed thereon and which has a bandgap wavelength in the range of 1.65 to 3.0 µm. The bandgap wavelength is a wavelength obtained by converting the bandgap energy into a light wavelength, and the bandgap wavelength (µm)=1.2398/bandgap energy (eV) holds.

In a related SWIR image pickup device using an $In_{0.53}Ga_{0.47}As$ absorption layer which is lattice-matched with an InP substrate, the sensitivity at a long wavelength side is only up to approximately 1.7 µm; however, according to the above structure, light having a wavelength of up to 1.9 µm at a long wavelength side can be reliably absorbed. Hence, a clearer image can be obtained. In particular, since the night glow is weak, the influence of a non-absorption wavelength region of 1.7 to 1.9 µm which cannot be absorbed by a related photodetector is significant, and by the presence of this non-absorption wavelength region, the image definition is degraded; however, by the above structure of the present invention, the above degradation can be overcome.

Furthermore, in a related device, when a dark current component of a photodetector is increased by an increase in temperature of the device due to usage conditions, the dynamic range (S/N ratio) cannot be improved, the noise is increased, and as a result, the device may not be used in some cases. In order to avoid the problem described above, a cooling device may be used in some cases. However, according to the structure described above, since light in a sufficiently wide wavelength band can be absorbed, the problem caused by the increase in temperature can be avoided.

In contrast, when the temperature is low, the sensitivity of a semiconductor photodetector is shifted to a short wavelength side. In a related device in which InGaAs is used for the absorption layer, since the SWIR light spectrum from the universe is only partly used, sufficient sensitivity cannot be obtained in a low-temperature atmosphere due the sensitivity shift, and an unclear image is unfavorably obtained in many cases. However, according to the above structure, since all the SWIR spectrum can be sufficiently used even when the sensitivity shift occurs, the above problem can be solved.

In addition, in the structure described above, since a quaternary or a quinary InGaAs-based compound is used for the absorption layer, the bandgap determining an absorbable long wavelength-side limit and the lattice parameter (to have the same lattice parameter as that of the InP substrate) can both be set to targeted values. Accordingly, since the crystalline defect density and the strain can be reduced while the limit at a long wavelength side is set to 3 µm, the dark current can be reduced, and lack of images (number of dark spots) can be significantly reduced. That is, according to the above structure, without forming a step buffering layer (graded layer) (that is, without forming an absorption layer having a lattice parameter larger than that of the InP substrate), the limit at a long wavelength side can be increased. Accordingly, compared to the case in which the step buffering layer is used, the strain and the defects of the absorption layer can be reduced; hence, as described above, the dark current caused by the defects can be reduced, and the number of dark spots (lack of images) can also be reduced.

The semiconductor photodetector described above has an InP substrate and an absorption layer formed thereon, the absorption layer has a GaInNAsP layer, and the P concentration of the GaInNAsP layer can be set to 0.01 to 1 atomic percent. By the structure described above, an absorption layer having a bandgap wavelength (longest detectable wavelength) in the range of 1.65 to 3.0 µm can be obtained, and any of the above image pickup devices can be realized. When the P concentration is more than 1 atomic percent, since the light emission intensity is decreased, the upper limit of the P concentration is set to 1 atomic percent. In addition, when the P concentration is less than 0.01 atomic percent, the effect of P cannot be obtained, and the bandgap energy cannot be reduced while the lattice parameter is made equivalent to that of InP.

The semiconductor photodetector described above has an InP substrate and an absorption layer formed thereon, the absorption layer has a GaInNAsSb layer, and the Sb concentration of the GaInNAsSb layer can be set to 0.1 to 10 atomic percent. By the structure described above, an absorption layer having a bandgap wavelength (longest detectable wavelength) in the range of 1.65 to 3.0 µm can be obtained, and any of the above image pickup devices can be realized. The GaInNAsSb layer is particularly superior in crystal quality and can be relatively easily and stably formed. When the Sb concentration is more than 10 atomic percent, since the lattice mismatch occurs, and the defect density is increased, the upper limit of the Sb concentration is set to 10 atomic percent. In addition, when the Sb concentration is less than 0.1 atomic percent, the effect of Sb cannot be obtained, and the bandgap energy cannot be reduced while the lattice parameter is made equivalent to that of InP.

The semiconductor photodetector described above has an InP substrate and an absorption layer formed thereon, the absorption layer has a GaInNAs layer, and the N concentration of the GaInNAs layer can be set to 0.01 to 12 atomic percent. By the structure described above, an absorption layer having a bandgap wavelength (longest detectable wavelength) in the range of 1.65 to 3.0 μm can be obtained, and any of the above image pickup devices can be realized. The N concentration has a significant influence on the bandgap energy, and at a concentration of 0.01 atomic percent or more, the bandgap energy can be reduced while the lattice parameter is made equivalent to that of InP. However, it is difficult to increase the N concentration to more than 12 atomic percent, and at a concentration of more than 12 atomic percent, the defect density is considerably increased.

A crystalline layer forming the absorption layer is preferably formed to have a lattice parameter which satisfies the degree of lattice mismatch represented by $|\Delta a/a| \leq 0.002$, where a indicates the lattice parameter of the above InP substrate, and Δa indicates the difference in lattice parameter between the InP substrate and the crystalline layer forming the absorption layer. According to the structure as described above, by the use of an InP substrate which can be commonly obtained, an absorption layer having superior crystal quality can be obtained.

As the above InP substrate, an off-angled substrate can be used which is inclined in the [111] direction or the [11-1] direction with respect to the (100) plane by 5 to 20°. By the structure described above, a GaInAsP layer, a GaInAsSb layer, or a GaInAs layer, having a small defect density and superior crystal quality, can be obtained, and an absorption layer can be obtained in which the dark current is reduced, and the number of dark spots is reduced. Hence, an absorption layer can be obtained which improves the properties of a device that absorbs weak night glow in the SWIR band and picks up an image. That is, the function of the absorption layer formed using the above off-angled substrate improves the quality, particularly, of an image pickup device that absorbs the night glow and picks up an image. The most preferable off angle is in the range of 10 to 15' in the [111] direction or the [11-1] direction with respect to the (100) plane, and by this off angle, an absorption layer which significantly reduces the defect density can be obtained. The above off angle has not been proposed for an InP substrate in the past, the effect thereof was first verified by the inventors of the present invention, and this off angle is a very important factor when an epitaxial film having superior crystal quality is formed on an InP substrate.

An InP window layer located so as to cover the above absorption layer may be provided. According to this structure, since the lattice parameter of the absorption layer and that of the InP substrate are the same, a window layer of InP which has actual performance to reduce the dark current can be formed on the absorption layer. As a result, the dark current can be reduced, and the element reliability can be improved. That is, when the lattice parameter is increased from the InP substrate to InAsP forming the absorption layer by providing a related step buffering layer, InAsP having a lattice parameter in conformity with the that of the absorption layer must be used for the window layer. An InAsP layer having a composition of a large lattice parameter as described above has inferior absorption sensitivity since having absorption from the vicinity of the MWIR band to a short wavelength side, and hence an unclear image is unfavorably obtained.

In addition, the image pickup device described above may be formed to absorb light in a wavelength region of 1.0 to 3.0 μm. Accordingly, a photodetector having a sensitivity at a wavelength of 1.0 to 3.0 μm can reduce the influence of an absorption peak (having a broad absorption in a wavelength region of more than 3.0 μm) in the medium wavelength infrared (MWIR) region of the waver absorption spectrum even under conditions of fog, smoke, or dust, and hence a clear image can be obtained. Furthermore, since image-pickup can be performed without using auxiliary light irradiation, the probability of damaging human eyes caused by light incident thereon can be fully removed. In addition, the reason the maximum wavelength is set to 3.0 μm is that although the mechanism has not been understood at this stage, when it is intended to absorb light having a wavelength of more than 3.0 μm, the quality of the epitaxial film of the absorption layer is degraded, and as a result, the dark current cannot be reduced. In addition, "to absorb light in a wavelength region of 1.0 to 3.0 μm" means that the photodetector has no sensitivity in a wavelength region other than that of 1.0 to 3.0 μm. This may include the case in which because of properties of a compound semiconductor forming the absorption layer, the sensitivity thereof is restricted in a wavelength region of 1.0 to 3.0 μm. In the case described above, the threshold sensitivity at a long wavelength side may be 2.0 μm or 2.5 μm. In addition, in particular, in order to realize a threshold sensitivity at a wavelength of 3.0 μm at a long wavelength side, a filter which cuts light having a wavelength of more than 3.0 μm may be provided.

A vision enhancement apparatus of the present invention comprises any one of the above image pickup devices. According to this structure, the dark current is reduced, an image having a small number of dark spots can be obtained, and the level of vision enhancement can be improved. For example, in a related in-vehicle vision enhancement apparatus, an object is irradiated with infrared light or near infrared light, and by absorbing reflection thereof, an image of the object is picked up; however, according to the structure described above, since the night glow in the SWIR band is used, irradiation means is not necessary, the vision enhancement device can be simplified, and as a result, the manufacturing cost can be reduced. Accordingly, a vehicle installing space and cost can be reduced, and in order to expand the use of this type of device, the above simplified structure is a very important factor. In addition, the problem of a vehicle installing space and manufacturing cost according to a method in which detection is performed using infrared light in combination with near infrared light can also be avoided.

In addition, since light is not irradiated, damage to human eyes caused by light irradiation can be avoided, and a mechanism or a system to shield light is not necessary. The feature of the vision enhancement device of the present invention is particularly valuable when it is used as an in-vehicle vision enhancement device that primarily attempts to detect a person in order to prevent bodily injury.

In addition, a problem (1) in that when infrared light emitted from an object is absorbed, the image definition is extremely degraded due to absorption by fog and/or moisture, and/or a problem (2) in that when radiant heat rays from an object or a living matter is absorbed, an object other than a living matter, the temperature of which is not so different from the ambient temperature, or a person wearing a cold-protection cloth is difficult to be detected can be reliably overcome when the device absorbing the SWIR night glow, according to the present invention, is used. The feature described above is also valuable when the vision enhancement device of the present invention is used as an in-vehicle vision enhancement apparatus which primarily attempts to ensure driving safety of the vehicle regardless of the driving environment.

In addition, another vision enhancement apparatus of the present invention is an device used for vision enhancement in a vehicle and has image pickup means for picking up an image of a forward field of view of the vehicle and display means for displaying the image picked up by the image pickup means, and any one of the image pickup devices may be used as this image pickup means. According to this structure, when the above vision enhancement device is mounted in a vehicle, a driver can drive in the night while more clearly recognizing a forward field of view of the vehicle as well as an obstacle.

In addition, still another vision enhancement apparatus of the present invention is an device for vision enhancement in a vehicle and has image pickup means for picking up an image of a backward field of view of the vehicle, display means for displaying the image picked up by the image pickup means, and control means performing control of drive of the image pickup means and the display means, and any one of the above image pickup devices may be used as this image pickup means. According to this structure, when the above vision enhancement device is mounted in a vehicle, a driver can drive in the night while more clearly recognizing a backward field of view of the vehicle as well as an obstacle.

A night-vision apparatus of the present invention is an optical apparatus which visualizes an object in the night and includes any one of the above image pickup devices. Hence, without using a light irradiation device, by absorbing light, such as the night glow, from a near infrared to an infrared region reflected from the object with good sensitivity, a clear dark field image can be obtained by an device having a simple structure. Accordingly, the device is easily portable, and in addition, the eye-safe problem caused by infrared irradiation can be avoided.

A navigation supporting apparatus of the present invention is an apparatus which is mounted in a vessel and which includes an optical device to recognize an object, such as another vessel, and any one of the above image pickup devices may be used as the optical device. By the structure described above, regardless of whether the weather is good or bad, and regardless of day and night, an image of the object, which cannot be easily and clearly picked up by an infrared camera when the temperature of the object is not so much different from the ambient temperature, can be reliably recognized.

A monitoring apparatus of the present invention is an apparatus which is placed at a fixed position and which includes an optical device to monitor an object, and any one of the above image pickup devices may be used as the optical device. Hence, without providing a light source irradiating the object in the monitoring device, the object can be reliably monitored. In addition, for example, the monitoring apparatus includes a monitoring device which monitors a platform and a train railroad provided at the side thereof in order to avoid a railroad accident; a monitoring apparatus which is provided in a door phone or the like to pick up an image of a visitor; a monitoring apparatus which determines whether a person is an invader or not; an indoor monitoring apparatus which monitors a room for caring purpose or the like and which sends an image to a caring center or the like; a monitoring apparatus for urban disaster prevention which detects the generation of fire and the place thereof; and a remote monitoring device which monitors from a remote place, for example, the change in place of a device which notifies an accident of large facilities, such as a dam.

According to the vision enhancement apparatus, the night-vision apparatus, the navigation supporting apparatus, and the monitoring apparatus, described above, the structure can be formed in which light irradiation means for irradiating infrared, near infrared, or visible light is not provided. Accordingly, the vehicle installing space, the space in the apparatus, the installation space, and the like can be decreased, and hence the cost therefor can be reduced.

In addition, in the vision enhancement apparatus, the night-vision apparatus, the navigation supporting apparatus, or the monitoring apparatus, described above, the structure can be formed in which light irradiation means for irradiating light having a wavelength of 1.4 µm or less is not provided. Accordingly, light irradiation at a wavelength of 1.4 µm or less, which has an unfavorable influence on human eyes, can be eliminated, and as a result, a system for preventing light from being irradiated to human eyes is not required.

Accordingly, the present invention provides an image pickup device, vision enhancement apparatus, night-vision apparatus, navigation supporting apparatus, or a monitoring apparatus, which can obtain a clear image regardless of day and night, and regardless of whether the weather is good or bad.

DETAILED DESCRIPTION OF THE INVENTION

First Embodiment

Figure 1:
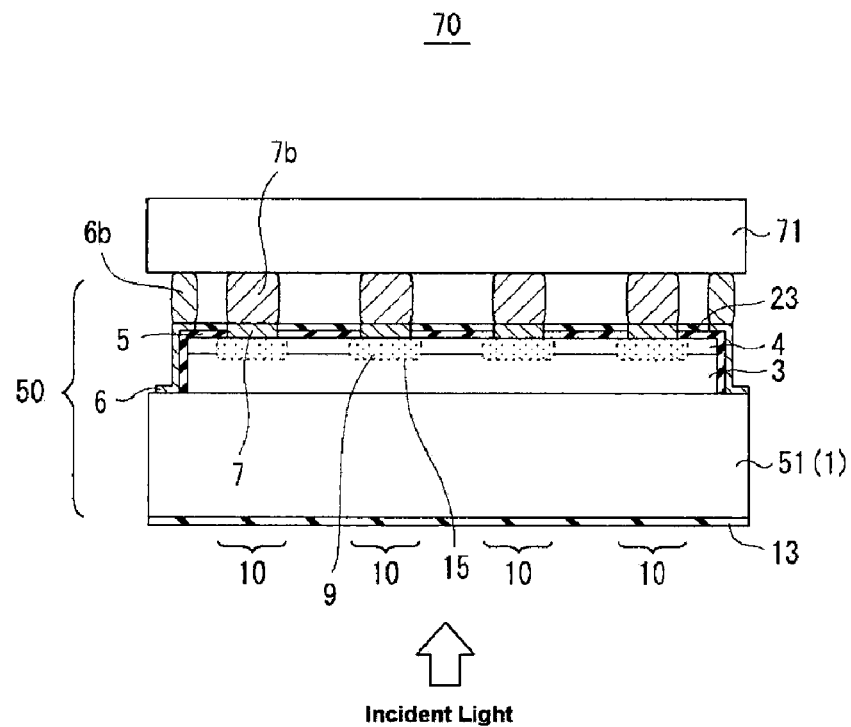
FIG. 1 is a schematic view showing an image pickup device according to a first embodiment of the present invention.
Figure 2:
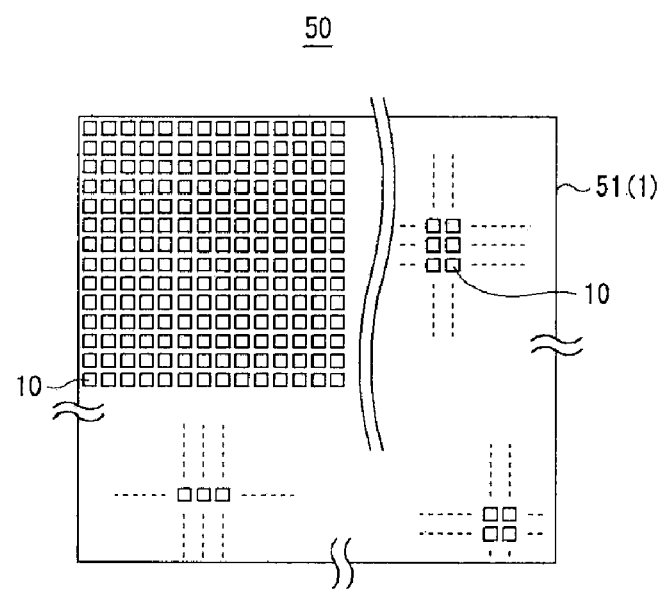
FIG. 2 is a view showing a photodiode array of the image pickup device shown in FIG. 1.
Figure 3:
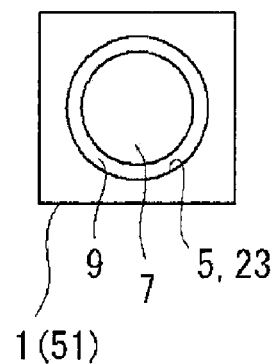
FIG. 3 is a view showing one photodetector of the photodiode array shown in FIG. 2.

FIG. 1 is a schematic view showing an image pickup device 70 according to a first embodiment of the present invention. In this figure, optical elements, such as a lens, are omitted. FIG. 2 is a view illustrating a photodiode array 50 of the above image pickup device 70. FIG. 3 is a view showing one photodetector 10 of the photodiode array 50 shown in FIG. 2. In FIG. 1, this image pickup device 70 is so-called epitaxial-side-down mounted so that an epitaxial-layer side of the photodetectors 10 formed on a common InP substrate 51 faces to a multiplexer 71 having a function as a mounting substrate. A p-electrode 7 electrically connected to a p-type region 9 of an epitaxial layer of each photodetector 10 and an n-electrode 6 provided on the common n-type InP substrate 51(1) are connected to the multiplexer 71 and send an electric signal thereto, and the multiplexer 71 receives an electric signal of each photodetector and performs a process to form an entire image of an object. The n-electrode 6 and the p-electrode 7 are electrically connected to the multiplexer 71 via bumps 6b and 7b, respectively. Incident light passes through an anti-reflection (AR) film 13 formed on a rear surface of the InP substrate 51 and is then absorbed at a pn junction 15, which is an interface between the p-type region 9 and an absorption layer 3. The p-type region 9 is formed by introduction through an opening portion of a Zn-diffusion mask 5 of SiN which is also used as a protection film. The Zn-diffusion mask pattern 5 remains together with a polyimide film pattern 23 formed thereon as a protection film. The structure of the photodiode array and that of the photodetector will be described below in detail with reference to FIGS. 2 and 3.

In FIG. 2, the photodetectors 10 of the photodiode array 50 are provided on the common InP substrate 51 (1). Electric signals, which are generated when the individual photodetectors absorb the night glow in the SWIR band, are sent to the multiplexer 71 which is also used as the mounting substrate as described above, and an image-forming process is performed. By changing the size of the photodetectors and the pitch therebetween, and the size of the array, the number of pixels is changed. The photodiode array 50 shown in FIG. 2 has 90,000 pixels. The photodetector 10 shown in FIG. 3 has a plurality of epitaxial films formed on the InP substrate 1 and also has the diffusion mask 5 for p-type impurity introduction which is used when the p-type region 9 is formed. The p-electrode 7 is connected to the p-type region 9 and is connected to a wire or the like of a mounting substrate, such as the multiplexer 71, through a solder bump or the like.

Figure 4:
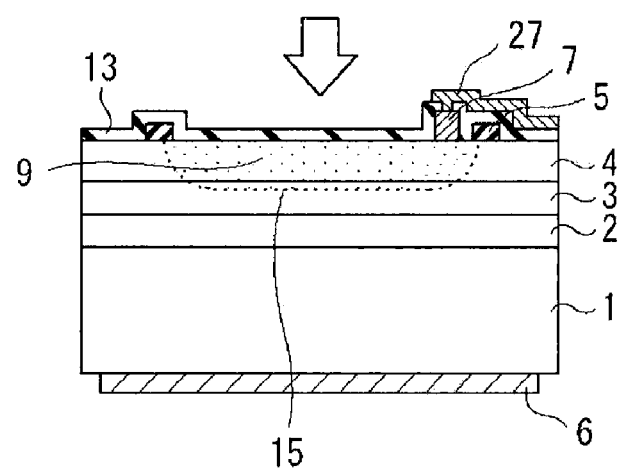
FIG. 4 is a cross-sectional view showing an epitaxial-side-up mounted photodetector.

FIG. 4 is a cross-sectional view illustrating an epitaxial-side-up mounted photodetector, which is different from the epitaxial-side-down photodetector shown in FIG. 1. In the present invention, the photodetector in the image pickup device may be either epitaxial-side-down mounted or epitaxial-side-up mounted. In this photodetector 10, an n-type InP buffer layer 2, the absorption layer 3, an InP window layer 4, the diffusion mask 5, and the antireflection (AR) film 13 are provided on the n-type InP substrate 1 in that order. The p-type region 9 is formed in an area from the InP window layer 4 to the pn junction 15 in the absorption layer 3. In addition, the n-electrode 6 is located on the rear surface of the n-type InP substrate, and the p-electrode 7 is located on the surface of the InP window layer 4 in the p-type region 9 and is electrically connected to a wire electrode 27. In this embodiment, the absorption layer 3 absorbs light in the wavelength range of 1.0 to 3.0 µm. In particular, the absorption layer 3 is formed from one of GaInNAsP, GaInNAsSb, and GaInNAs.

The photodetector shown in FIG. 4 is epitaxial-side-up mounted as described above, and light is incident on the epitaxial layer side, that is, on the InP window layer 4 side. The photodetector of this embodiment may be either epitaxial-side-up mounted or epitaxial-side-down mounted as described above, and as shown in FIG. 5, the photodetector may be an epitaxial-side-down mounted type in which light is incident on the rear surface side of the Inp substrate 1. In the case of the epitaxial-side-down mounted photodetector 10 shown in FIG. 5, the AR film 13 is provided on the rear surface of the InP substrate 1. The InP window layer 4, the p-electrode 7, and the diffusion mask 5 of SiN also used as a protection film are provided as the case of the epitaxial-side-up mounted type. In the case of the epitaxial-side-down mounted photodetector 10 shown in FIG. 5, since InP, such as the InP substrate, is transparent to the SWIR band light, the SWIR band light is not absorbed thereby and reaches the pn junction of the absorption layer 3. In the structure shown in FIG. 5, the absorption layer is formed from one of GaInNAsP, GaInNAsSb, and GaInNAs. In the following examples of the present invention, the absorption layer has the same structure as described above, unless particularly stated otherwise.

Figure 5:
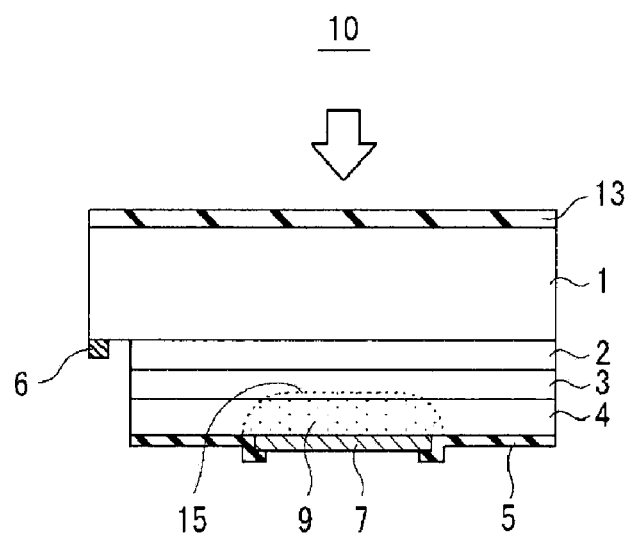
FIG. 5 is a cross-sectional view showing an epitaxial-side-down (flip-chip) mounted photodetector.

The p-electrode 7 and the n-electrode 6 may be disposed to face each other with the InP substrate 1 interposed therebetween, as shown in FIG. 4, or may be disposed at the same side of the InP substrate 1 as shown in FIG. 5. In the case of the structure shown in FIG. 5, each of the photodetectors 10 of the photodiode array 50 shown in FIG. 2 is electrically connected to an integrated circuit by flip-chip mounting. In the photodetectors having the structures shown in FIGS. 4 and 5, light which reaches the pn junction 15 is absorbed and generates a current signal, and as described above, the signal thus generated is converted into an image of one pixel through the integrated circuit.

The InP substrate 1 is preferably an off-angled substrate inclined in the [111] direction or the [11-1] direction by 5 to 20° with respect to the (100) plane. A substrate inclined in the [111] direction or the [11-1] direction with respect to the (100) plane by 10 to 15° is more preferable. By using the substrate having a large off angle as described above, the n-type InP buffer layer 2, the absorption layer 3 (GaInNAsP layer, GaInNAsSb layer, or GaInNAs layer), and the InP window layer 4, having a small defect density and superior crystal quality, can be obtained. As a result, an absorption layer in which the dark current is reduced and the number of dark spots is decreased can be obtained. Hence, an absorption layer that can significantly improve the performance of a device which picks up an image by absorbing weak night glow in the SWIR band can be obtained. That is, the function of the photodetector formed on the above off-angled substrate is particularly effective to improve the quality of an image pickup device that picks up an image by absorbing the night glow.

Although the large off angle as described above has not been proposed for an InP substrate in the past, the function thereof is first verified by the inventors of the present invention, and this off angle is a very important factor when an epitaxial film having superior crystal quality is formed on an InP substrate. For example, a compound semiconductor containing N, such as GaInNAs, which is believed to be able to emit and absorb light in a very long wavelength region, cannot be formed into a superior and practically usable epitaxial layer unless an InP substrate having a large off angle as described above is used. That is, if an InP substrate having a large off angle as described above is not used, a compound semiconductor containing N, such as GaInNAs, cannot be formed into an absorption layer in which the dark current is reduced, and the number of dark spots is decreased. As a result, a clear image cannot be obtained by using weak night glow in the SWIR band. Besides the GaInNAs described above by way of example, the same thing can also be said for GaInNAsP and GaInNAsSb, that is, in other words, in order to obtain superior crystal quality, it is necessary to use an InP substrate having a large off angle as described above.

Figure 25:
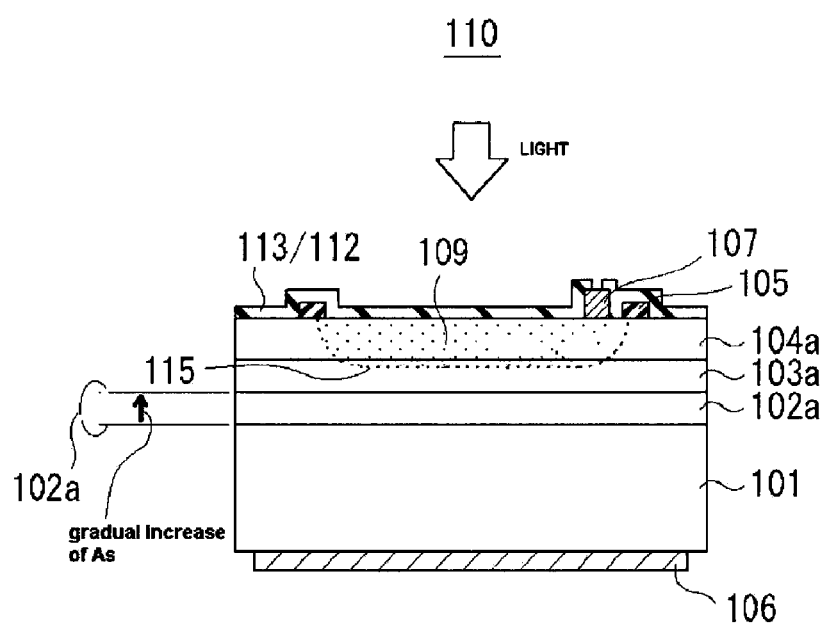
FIG. 25 is a view showing a related photodetector (Comparative Example B).

The photodetectors 10 shown in FIGS. 4 and 5 each have the InP window layer 4 located so as to cover the absorption layer 3. Since the lattice parameter of the absorption layer 3 is the same as that of the InP substrate 1, the InP window layer 4, which has been well known to reduce the dark current, can be formed on the absorption layer 3. Accordingly, the dark current can be reduced, and the element reliability can be improved. That is, as shown in FIG. 25, in a related photodetector 110, by forming a step buffering layer or a graded layer 102a, the lattice parameter is increased from an InP substrate 101 to an absorption layer of InGaAs 103a. In the case of the structure as described above, the window layer must be an InAsP window layer 104a having a composition in conformity with the lattice parameter of the absorption layer 103a. In the InAsP window layer 104a of a composition having such a large lattice parameter, since absorption occurs from the vicinity of the medium wavelength infrared (MWIR) region to a short wavelength side, the absorption sensitivity is generally degraded, and particularly in an atmosphere containing moisture at a high concentration, an unclear image is unfavorably obtained (see FIG. 22). In the photodetectors 10 shown in FIGS. 4 and 5, since the lattice parameter of the absorption layer 3 is approximately equivalent to that of the InP substrate 1, an InP layer can be used for the window layer, and hence the dark current can be reduced.

Second Embodiment

Figure 6:
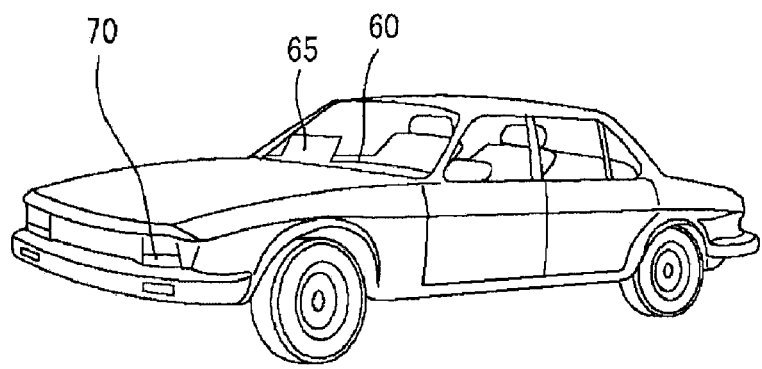
FIG. 6 is a view showing a vision enhancement apparatus according to a second embodiment of the present invention.
Figure 7:
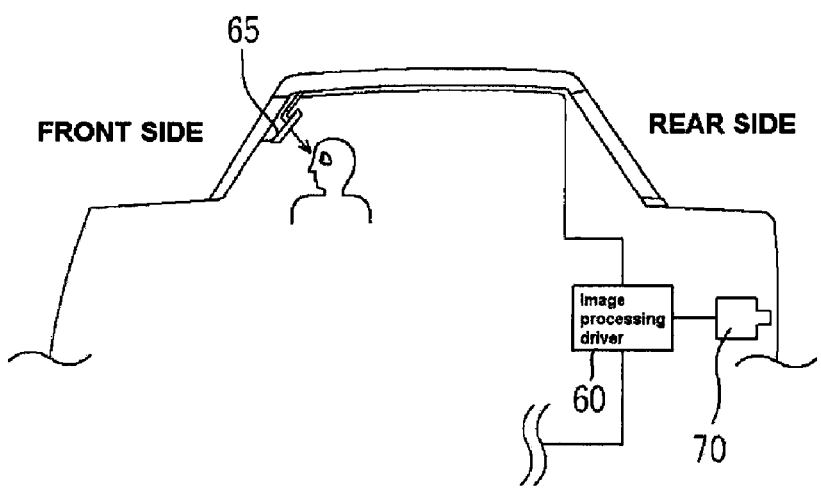
FIG. 7 is a view showing a modified example of the vision enhancement apparatus shown in FIG. 6.

FIG. 6 is a vision enhancement apparatus according to a second embodiment of the present invention. This vision enhancement apparatus is mounted in a vehicle to enhance a forward field of view of a driver of the vehicle in the night. In the vehicle, there are mounted the image pickup device 70 which includes the photodiode array described in the first embodiment and optical elements, such as a lens, not shown in the figure, a display monitor 65 displaying a picked-up image, and a control device 60 performing control of drive of these devices. In addition, as shown in FIG. 7, in order to enhance a backward field of view of a driver of a vehicle in the night, a vision enhancement apparatus is mounted in the vehicle. The image pickup device 70 described in the first embodiment, which includes the photodiode array and optical elements, such as a lens, not shown in the figure and which is mounted in a back side of the vehicle to face in a backward direction, picks up an image, and the image thus picked up is displayed on the display monitor 65 disposed at an upper frontal side of the driver. The control of drive of the image pickup device 70 and that of the display device 65 are performed by the control device 60.

In a related in-vehicle vision enhancement apparatus, since light in an infrared region reflected or emitted from an object is absorbed to form an image, there have been the following problems. When the reflected light is used, since a light source is necessary, an installation space therefor is required, and in addition, the cost is increased. In addition, when heat radiated from an object is used, a non-heating element other than a human, a pedestrian wearing a cold-protection cloth, and the like are difficult to be recognized, and hence recognition means other than an infrared camera must also be used. In addition, when a light source is used, since a human body may be influenced in some cases depending on a wavelength region used for this light source, eye-safe measures must be prepared.

According to the vision enhancement apparatus of this embodiment, the additional light source and eye-safe measures as described above are not necessary. In addition, regardless of whether heat is radiated from an object or not, the image thereof can be picked up. Furthermore, even under conditions of fog or the like, containing moisture, a clear image of the object can be obtained. Hence, superior invehicle vision enhancement device used in the night can be provided. The reason for this is that a photodetector is used which employs the night glow in the SWIR band reflected from an object, which sufficiently reduces the dark current, and which has a superior dynamic range (S/N).

Third Embodiment

Figure 8:
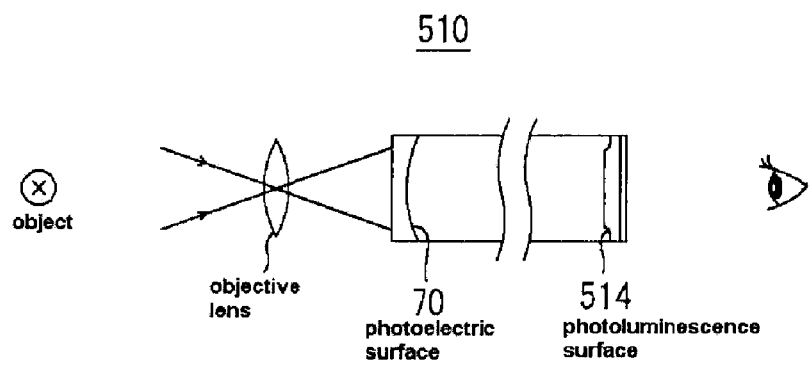
FIG. 8 is a view illustrating the structure of a night-vision apparatus according to a third embodiment of the present invention.

FIG. 8 is a view showing the structure of a night-vision apparatus 510 according to a third embodiment of the present invention. This night-vision apparatus 510 is characterized in that the image pickup device 70 of the first embodiment or an image pickup device in which the two-dimensional arrangement plane of the photodetectors of the first embodiment is transformed into a curved plane is disposed in an image pickup portion. Since the above image pickup device 70 has a high absorption sensitivity from a near infrared to an infrared region and can reduce the dark current, a light source, such as an infrared emission element, is not necessarily incorporated in the night-vision device, and as described below, the basic properties of the night-vision device of this embodiment can be made fundamentally different from those of a related night-vision device incorporating an infrared emission source.

Light from a near infrared to an infrared region, such as the night glow, reflected from an object passes through an objective lens and then forms an image at a photoelectric surface portion 70. A current obtained by the photoelectric conversion at the photoelectric surface portion 70 is amplified by an optional method which is currently used and is then converted into an image at a display portion so as to be displayed. In accordance with the amplification mechanism, a display surface may be appropriately selected, and for example, when current is extracted from each pixel at the photoelectric surface and is then amplified by an amplifier circuit, a liquid-crystal screen may be used, or when amplification is performed by an image intensifier, an image may be displayed on a fluorescent screen and may be observed through an ocular lens. The image intensifier is formed of a microchannel plate MCP which increases an electronic image converted at the photoelectric surface portion twice, a fluorescent screen which is provided behind the MCP and which again converts the electronic image into an optical image, and a fiber plate which is provided behind the fluorescent screen and which divides an object image, which is converted into the optical image, into pixels and transmits the pixels.

In a related night-vision apparatus, infrared-emitting diodes are disposed in a main body, and infrared light which is emitted from the infrared diodes and is then reflected from an object is absorbed, so that a dark field image of the object is obtained. However, in the night-vision apparatus 510 of this embodiment, since the photoelectric surface portion 70 is formed of the two-dimensional array of the photodetectors 10 or the image pickup device, which is described in the first embodiment, an absorption layer having a high sensitivity in a near infrared region can be used. Accordingly, even if infrared-emitting diodes or the like are not provided in the main body, by absorbing the night glow reflected from an object, a clear dark field image, which may not cause any practical problem, can be obtained. As a result, since the weight and the size of the night-vision device can be reduced, it can be easily portable, and in addition, an eye-safe problem caused by infrared irradiation can be avoided. Furthermore, when animals are observed, some kinds of animals (such as snakes) sense infrared irradiation, and hence the night-vision device of this embodiment is particularly preferably used, for example, to observe the behavior of animals in the night.

Fourth Embodiment

Figure 9:
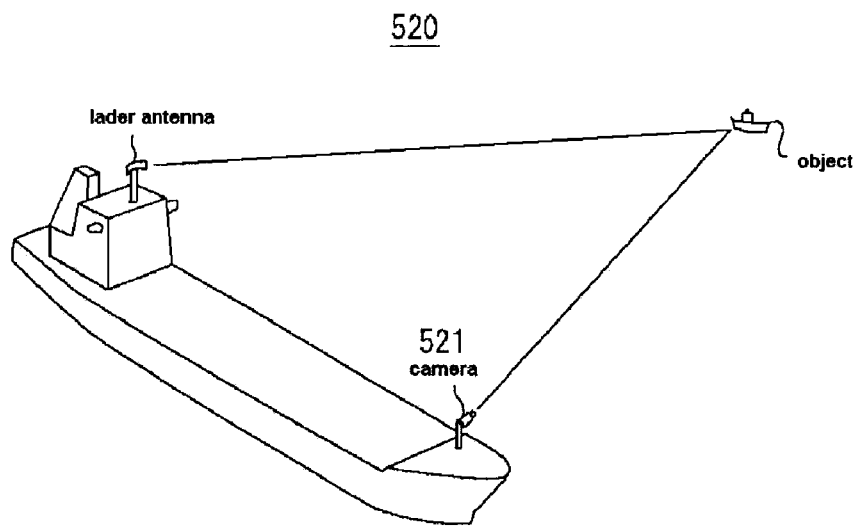
FIG. 9 is a view illustrating a night navigation supporting apparatus according to a fourth embodiment of the present invention.

FIG. 9 is a perspective view illustrating a night navigation supporting apparatus 520 according to a fourth embodiment of the present invention. As shown in FIG. 9, this night navigation supporting apparatus 520 has a rader device formed of a rader antenna and the like. The rader antenna is disposed at a position on a vessel having a fine view, is rotated in a horizontal plane by a control circuit or the like (not shown), and detects an object, such as another vessel, which is present around. In addition, a rader indicator disposed in the vessel is an indicator to display an object, which is detected by the rader antenna, and to output a signal indicating a relative position of the object with respect to the own vessel.

A camera 521 is disposed at a predetermined position (apart from the rader antenna by a predetermined distance) on the vessel. This camera 521 is characterized in that the image pickup device 70 including the absorption layer 3 described in the first embodiment is incorporated. The camera 521 is mounted, for example, on a camera mount including a horizontal-axis and a vertical-axis motor, and the direction of the camera can be controlled around the vertical axis and the horizontal axis. The camera 521 is driven when an object is detected by the rader indicator and is selected as a target to be picked up. In addition, the horizontal-axis motor and the vertical-axis motor incorporated in the camera mount are driven so that this target is continuously detected by the camera 521 and is continuously displayed on the indicator. For this tracking shooting by the camera 521 as described above, an object tracking computing unit is provided. When a predetermined object is set as a tracking object, the object tracking computing unit drives the camera 521 and also starts the control of drive of the motors incorporated in the camera mount so as to enable the camera 521 to start the tracking shooting of the object.

Since a related infrared camera which has been currently used detects the difference in temperature between an object and the environment or detects infrared light emitted from the object, it is difficult to detect an object having a temperature not different from that of the environment. In addition, when infrared irradiation means is additionally provided, it is difficult to obtain a necessary amount of infrared light over a wide range. Since the camera 521 incorporates the image pickup device 70 of the first embodiment as described above, the sensitivity in a near infrared region is superior, the temperature different is not necessarily used, and regardless of day and night, the sensitivity is not influenced by a sea surface temperature. In addition, since the camera has a high sensitivity in a wavelength region which is not likely to be influenced by water vapor, the sensitivity is not likely to be influenced by rain, fog, or the like, and hence, an object can be clearly detected even in the night.

Fifth Embodiment

Figure 10:
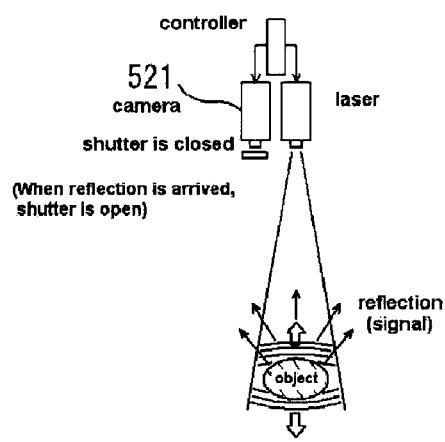
FIG. 10 is a view illustrating a laser rader of a night navigation supporting apparatus according to a fifth embodiment of the present invention.

FIG. 10 is a view illustrating the principle of a laser rader which is a core technique of a night navigation supporting apparatus according to a fifth embodiment of the present invention. A laser rader of this embodiment is characterized in that a camera incorporating the image pickup device 70 described in the first embodiment is disposed. A turning mount for the laser rader has functions to change an elevation angle and to turn the laser rader and is controlled by a control circuit.

In the laser rader in which the camera is disposed, a laser head, a light-transmission optical system, a light-absorption zoom camera, a camera head, and the like are disposed. The laser head is formed, for example, of a semiconductor laser which emits an invisible extremely-short laser pulse having a wavelength in a near infrared region. In addition, the camera head is formed, for example, of the above camera 521 which absorbs reflection of the above laser pulse.

With reference to FIG. 10, the principle of the laser rader of the night navigation supporting apparatus of this embodiment will be described. The laser pulse is emitted to an object; however, floating particles, such as rain, and fog, are present between the laser and the object. First, when laser light is emitted from the laser to the object, since a shutter of the camera 521 is closed, light reflected from the floating particles present in front of the object is blocked by the shutter and does not reach the camera 521. In addition, as shown in FIG. 10, after light reaches the object and is then reflected thereby, the shutter is opened for a moment when the above reflected light reaches the camera 521, and hence the light reflected from the object which is located at a specific distance can only be absorbed.

By the above laser rader, the distance between the laser and the object can be set by adjusting the timing of opening the shutter, and by using the high sensitivity camera 521, regardless of day and night, and even under bad weather conditions, such as rain or fog, and high wave conditions, the influences thereof can be significantly removed, and the object can only be observed. In addition, the shape of an object made of nonferrous material, such as a wood or a plastic-made small vessel or a sea surface flotage, can even be viewed. Furthermore, in the camera 521, since the image pickup device 70 of the first embodiment is used in combination with an image intensifier functional component, for example, the wavelength region of laser light of the laser rader can be set to a near infrared region which is not likely to be influenced by rain, fog, and the like, and as a result, a clearer image can be obtained.

Sixth Embodiment

Figure 11:
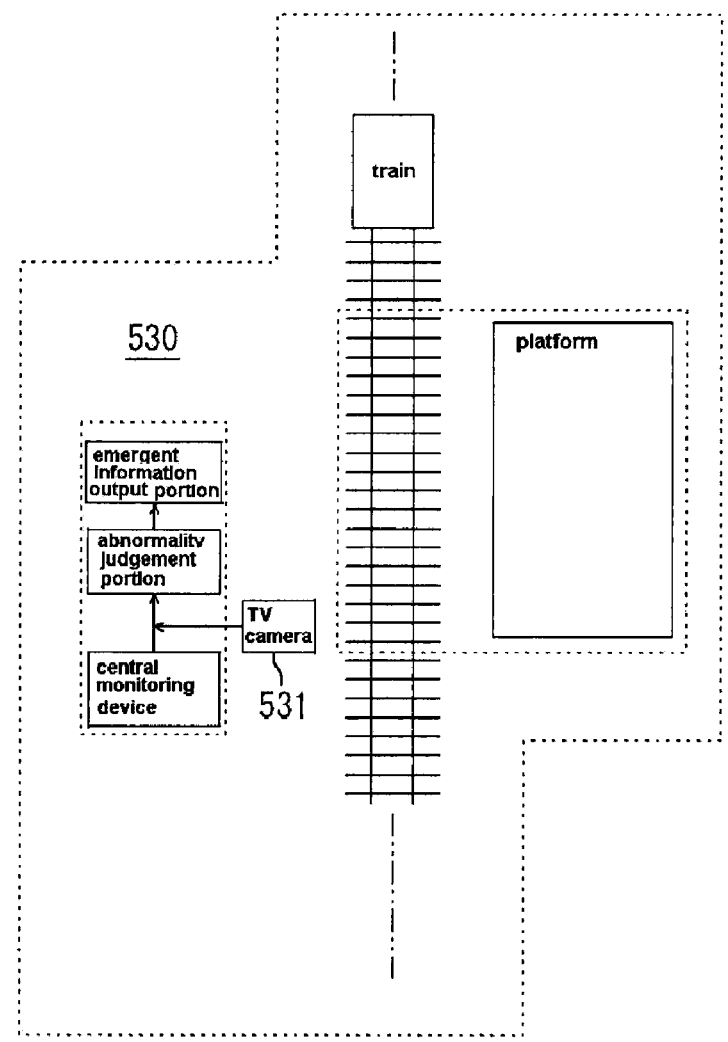
FIG. 11 is a view illustrating a railroad-accident avoidance unit according to a sixth embodiment of the present invention.

FIG. 11 is a view showing a railroad-accident avoidance unit according to a sixth embodiment of the present invention. The feature of this embodiment is that the image pickup device 70 described in the first embodiment is incorporated in a TV camera 531. In FIG. 11, this railroad-accident avoidance unit has the TV camera 531 which picks up an image of a predetermined area for monitoring, an abnormality judgment portion, a central monitoring device performing a quick action to avoid an accident after an obstacle intruding into a train railroad is detected by the TV camera 531, and an emergent information output portion which outputs the generation of an emergent situation.

One or a plurality of TV cameras 531 is provided to monitor a predetermined area, such as an entire train railroad laid down in an area of a platform. When only one TV camera 531 is used, an image-pickup area includes a train railroad and the platform in front of a train.

Since the TV camera 531 incorporates the image pickup device 70 shown in FIG. 1, a clear image can be obtained. In addition, even under conditions of rain, fog, or the like, since the TV camera 531 has a high sensitivity in a wavelength region which is unlikely to be influenced by moisture, reliable monitoring can be performed regardless of whether the weather is good or bad. In addition, since infrared light or the like is not necessarily irradiated, the eye-safe problem for many passengers can be avoided.

Seventh Embodiment

Figure 12:
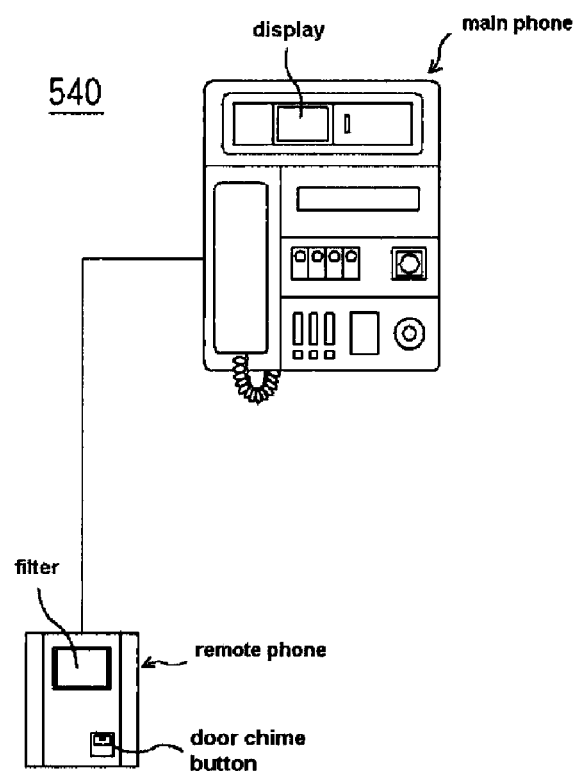
FIG. 12 is a view illustrating a visitor monitoring unit according to a seventh embodiment of the present invention.

FIG. 12 is a view showing a visitor monitoring unit 540 according to a seventh embodiment of the present invention. This visitor monitoring unit 540 is formed of a camera-incorporated door phone which includes a main phone and a remote phone. The remote phone is provided on a door, and when a visitor pushes a button of a door chime, an image of the visitor is picked up through a filter. The main phone is provided indoors, and the image of the visitor picked up by the camera of the remote phone is displayed on a display screen of the main phone.

Figure 13:
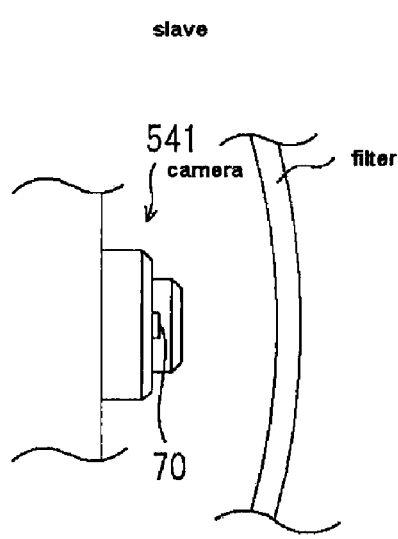
FIG. 13 is a view illustrating a camera provided in a remote phone of a door phone device shown in FIG. 12.

FIG. 13 is a view showing a camera 541 incorporated in the remote phone. The camera 541 includes the image pickup device 70 shown in FIG. 1 and picks up the image of the visitor. In this embodiment, since the visitor can be recognized by the image pickup device 70, which includes the absorption layer having a high sensitivity from a near infrared to an infrared region, using reflection of the night glow or the like, it is not necessary to provide an infrared light emission element in the remote phone as a related camera-incorporated door phone. Accordingly, for example, a problem in that by reflection of the infrared light emission element, a virtual image thereof is formed around the image of the visitor may not arise, and hence it is not necessary to provide a tube-shaped wall around the camera to prevent the above problem. In addition, the eye-safe problem caused by infrared irradiation can be avoided, and further an electric power for a light source, such as an infrared emission LED, can be saved. Accordingly, the structure of the remote phone of the camera-incorporated door phone can be simplified, the consumption power can be reduced, and the eye-safe problem can be avoided. Furthermore, since the night glow is constant day and night, a clear image of the visitor can be obtained without having any strange feeling caused by different conditions of day and night.

Eighth Embodiment

Figure 14:
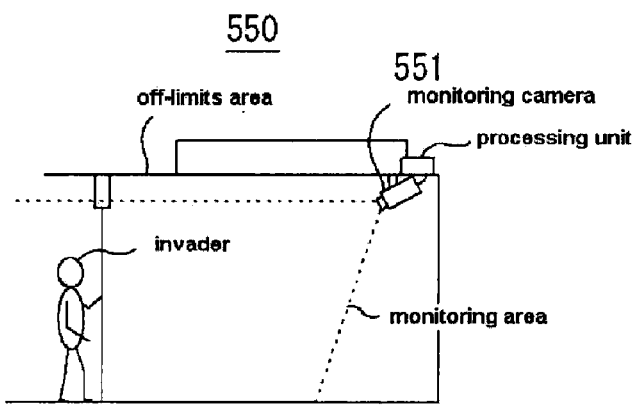
FIG. 14 is a view illustrating an invader monitoring apparatus according to an eighth embodiment of the present invention.

FIG. 14 is a view showing an invader detection apparatus 550 according to an eighth embodiment of the present invention. A monitoring camera 551 is disposed indoors so as to monitor outside through a transparent window. The monitoring camera 551 incorporates the image pickup device 70 of the first embodiment shown in FIG. 1 and has a high sensitivity from a near infrared to an infrared region. After the monitoring camera 551 picks up an image of a person outside the window, the image thus obtained is sent to a processing device to detect the person. In addition, the length of time that the person stays in the vicinity of the window is measured, and when the staying time is a predetermined time or more, such as 1 minute or more, which indicates that the person will invade with high probability, the person is regarded as a person who intends to invade.

Since the monitoring camera 551 of this embodiment incorporates the image pickup device 70 having a high sensitivity from a near infrared to an infrared region, an infrared irradiation device is not necessary. The monitoring camera 551 can detect a person, who intends to invade, with a high discrimination power by absorbing the night glow reflected from the person. Hence, the structure of this type of monitoring apparatus can be simplified. In addition, in a related invader monitoring device, a person to be picked up is intensively irradiated with infrared light; however, according to this embodiment, the eye-safe problem which may frequently occur can be avoided. In addition, when a plurality of invaders is present, clear images thereof cannot be obtained by infrared irradiation; however, when infrared irradiation is not performed, clear information can be obtained.

In addition, although not shown in the figure, in a related monitoring device which is different from the above type, an infrared LED must be disposed as a light source. For example, at two sides (two wings) of a monitoring camera, substrates are disposed so that angles thereof with respect to an object are optionally changed by motor drive, and on the substrates, a plurality of light-emitting LEDs is provided. A monitoring area is irradiated with infrared light emitted from the light-emitting LEDs, and the monitoring camera picks up an image by absorbing reflection of the light. When a lens of the monitoring camera is changed from a standard to a wide-angle lens or is changed from a wide-angle to a standard lens, or when the monitoring area is changed, brightness data of image signals from the monitoring camera is obtained and is then calculated, so that brightness distribution is detected. When the brightness is not uniform, the irradiation angles of the light-emitting LEDs are changed by changing the angles of the substrates with respect to the object by the motor drive so as to obtain a uniform brightness distribution.

Figure 15:
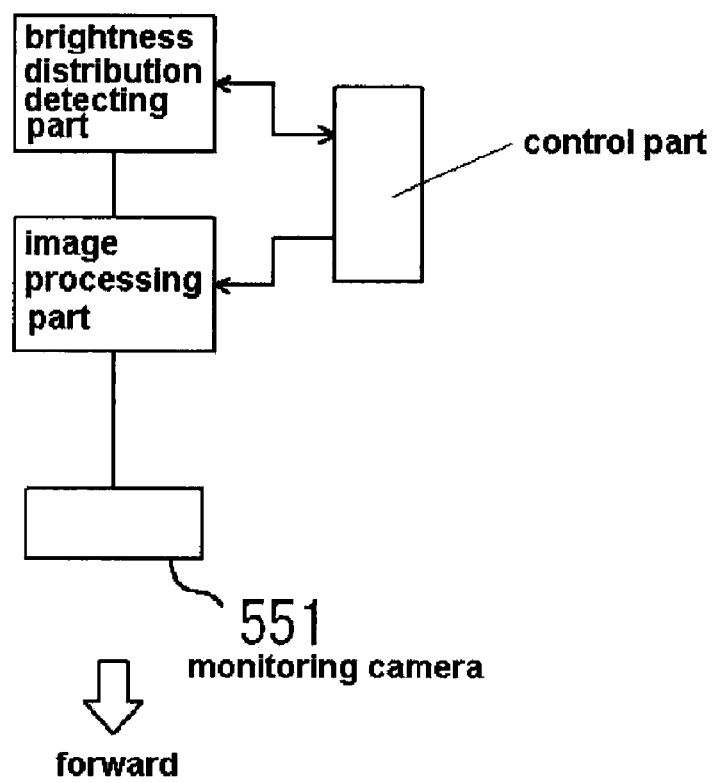
FIG. 15 is a view illustrating a modified example of the invader monitoring apparatus according to the eighth embodiment of the present invention.

On the other hand, in the monitoring camera 551 of a modified example according to this embodiment shown in FIG. 15, since the image pickup device 70 having a high sensitivity from a near infrared to an infrared region is used, when the monitoring camera 551 is incorporated in a monitoring device to monitor a dark place, a clear image can be picked up without using light-emitting LEDs, and the brightness distribution can be detected with high accuracy. Furthermore, since reflection of the night glow can be absorbed with a high sensitivity, regardless of whether an image pickup area is increased by using a wide-angle lens or is decreased by using a standard lens, the substrate provided with the light-emitting LEDs, the motor for changing the angle, a control device therefor, and the like can be omitted, and hence the structure of the monitoring device can be very simplified.

Ninth Embodiment

Figure 16:
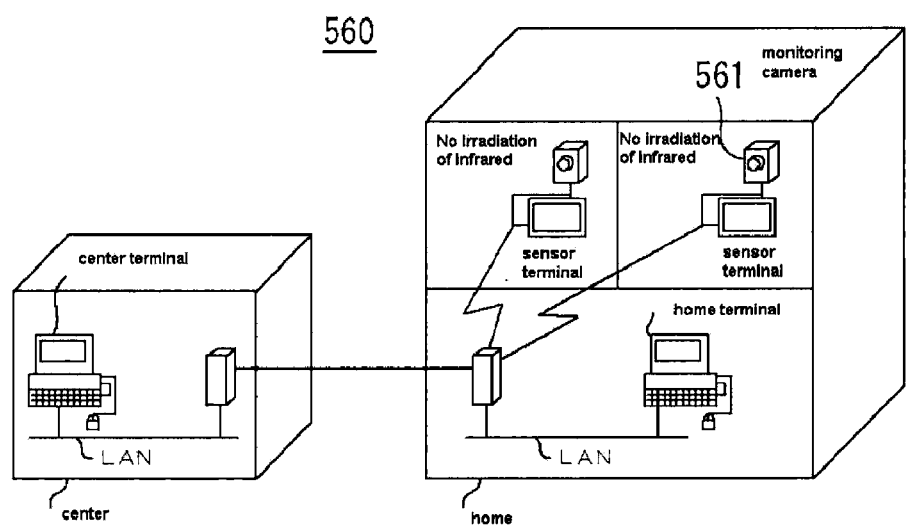
FIG. 16 is a view illustrating an indoor monitoring apparatus according to a ninth embodiment of the present invention.

FIG. 16 is a view illustrating an indoor monitoring apparatus 560 according to a ninth embodiment of the present invention. In FIG. 16, a monitoring camera 561 incorporates the image pickup device 70 shown in FIG. 1 and is disposed so as to pick up an indoor image of a house. In addition, a sensor terminal is formed integrally with the above monitoring camera and processes an image picked up by the monitoring camera, and by calculating the human existing probability or the like, the presence of a person is determined. The determination result obtained by this sensor terminal is informed to a home terminal through a local area network (LAN) and is then passed from the home terminal to a center terminal of a center through a phone line.

As long as the image pickup device 70 is incorporated, for example, an artificial retina camera may be used as the monitoring camera 561. In a related infrared camera which has been used, irradiation of infrared light must always be performed by an infrared lamp for all living environment of an indoor resident (care receiver), and hence influence of infrared irradiation on the care receiver cannot be ignored. In addition, by a fixed-point monitoring, at a position which is not directly irradiated, the care receiver's expression and motion cannot be clearly observed, and as a result, implementation of an appropriate action may be delayed in some cases. Since the image pickup device 70 has a high light absorption sensitivity from a near infrared to an infrared region, without performing infrared irradiation, regardless of whether it is dark or bright, the monitoring camera 561 can pick up a highly sensitive image, can calculate the human existing probability with high accuracy, and can avoid the delay of performing an appropriate action.

Tenth Embodiment

Figure 17:
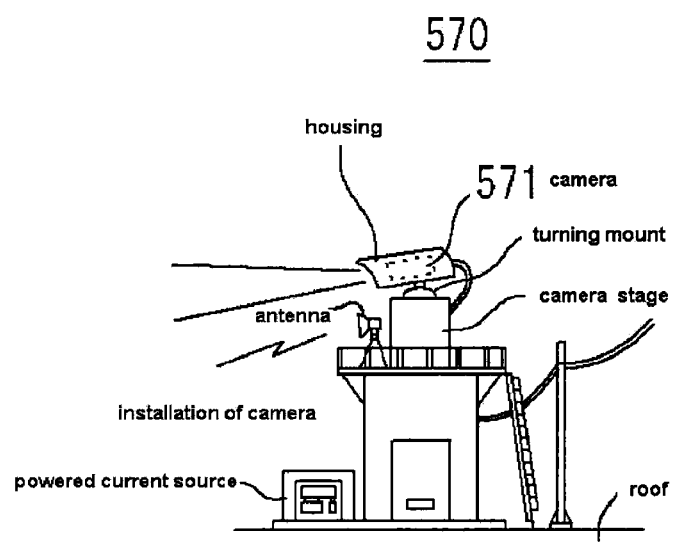
FIG. 17 is a view illustrating a monitoring apparatus for urban disaster prevention according to a tenth embodiment of the present invention.

FIG. 17 is a view illustrating a monitoring apparatus 570 for urban disaster prevention, according to a tenth embodiment of the present invention. This monitoring apparatus 570 for urban disaster prevention can automatically detect fire and can also easily specify a place where the fire occurs. As the structure of this apparatus, for example, a camera stage is provided on a roof of a building, and a monitoring camera 571 is received in a camera housing mounted on a turning mount provided on the camera stage. The monitoring camera 571 of this embodiment is characterized in that the image pickup device 70 shown in FIG. 1 is incorporated. Accordingly, infrared light emitted from fire or the like can be detected with good sensitivity.

In this monitoring apparatus, by driving the turning mount mounting the monitoring camera, the image pickup direction of the monitoring camera 571 is changed, and by monitoring the angle at this stage, an infrared image of a predetermined urban area can be picked up. When the image signal is computed, and a local heat source is recognized, the place where fire occurs can be detected. When the image pickup direction of the monitoring camera 571 at this stage is plotted on coordinate axes overlapped with an overhead view by using the monitoring device, the place where fire occurs can be accurately obtained. By a related infrared camera which has been used, when infrared light emitted from flames is picked up, a place of a large flame is excessively bright, and halation occurs; however, other places may be unclear in some cases, and hence recognition of flames and that of environmental conditions cannot be easily performed at the same time. However, by the monitoring camera 571 of this embodiment, since the image pickup device 70 is incorporated, and light in a near infrared region is detected, no halation occurs even if flames are present, and hence the place of fire and the environmental conditions thereof can be recognized with high accuracy.

In addition, although not shown in the figure, according to another related monitoring apparatus for urban disaster prevention, a monitoring camera which visualizes infrared light emitted from flames is used as a fire detection sensor, and a fire determination device is used which performs image processing of a near infrared image picked up by the monitoring camera; hence, fire is reliably detected at an early stage, and the place of the fire is also specified. In the monitoring apparatus for urban disaster prevention, according to the tenth embodiment of the present invention, compared to the above related monitoring device for urban disaster prevention, the image pickup device 70 shown in FIG. 1 is incorporated in the monitoring camera which visualizes infrared light emitted from flames. Hence, by performing image processing of a near infrared image picked up by the monitoring camera of the above monitoring device according to the tenth embodiment, regardless of whether the weather is good or bad, fire can be reliably detected at an early stage, and the place of the fire can also be specified. Furthermore, by adding functions of a fire determination device, the fire condition can be recognized by using a near infrared image, and highly accurate temperature information can also be obtained.

Eleventh Embodiment

Figure 18:
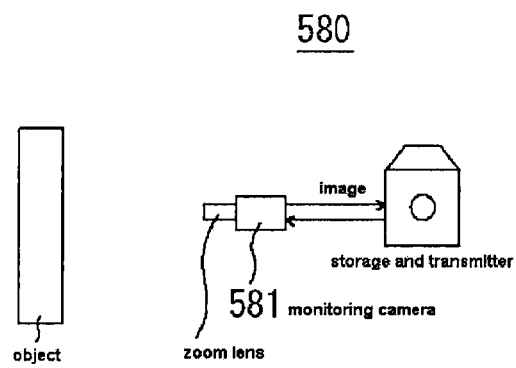
FIG. 18 is a view illustrating a remote monitoring apparatus according to an eleventh embodiment of the present invention.

FIG. 18 is a view illustrating a remote monitoring apparatus 580 according to an eleventh embodiment of the present invention. In this remote monitoring apparatus 580, electric wiring is not required when day-and-night monitoring is performed. In addition, during monitoring in the night, night lighting is not required. In this embodiment, a monitoring camera 581 is characterized in that the image pickup device 70 shown in FIG. 1 is incorporated.

According to this remote monitoring apparatus, when an object is monitored from a remote place by using the monitoring camera 581, a light accumulation material or the like is not necessarily disposed at a place at which the object to be monitored is located. In addition, the object to be monitored is not particularly limited, and any object can be monitored. For example, as the object, there may be mentioned a weep hole of a check dam, a line indicating a water level of a dam or a level of sediment deposition, facilities and equipment of a plant, a house, a building, a pad lock on a fence in a controlled area, and an observation device installed in the mountains.

When the light accumulation material is not used, the material cost thereof can be omitted, and man-hour for initial installation of the material and that for reinstallation thereof concomitant with aging degradation can also be omitted. In addition, a problem that occurs when the light accumulation material is not disposed in a wide area can be solved. That is, although an invader invading through a path along which the light accumulation material is not disposed cannot be recognized, and environmental conditions during heavy rain cannot also be recognized even when the light accumulation material is locally disposed, when the monitoring camera 581 incorporating the image pickup device 70 is used, since it has a high sensitivity from a near infrared to an infrared region, a clear image can be obtained without using an infrared emission device. In addition, of course, an infrared light projector (infrared emission device) is not necessary. As a result, for example, the device can be simplified, the size thereof can be reduced, and the cost can also be reduced.

Next, in order to show the properties of the image pickup device, image pickup devices according to Examples C1 to C3 of the present invention and Comparative Examples A and B were formed, and the properties (dark current and sensitivity spectrum) were compared to each other. First, conditions of forming the individual image pickup devices will be described.

Example C1 of the Present Invention

The photodetector 10 having the structure in which epitaxial layers were formed at an incident side, as shown in FIG. 4, was formed. The electrodes and the individual epitaxial layers were sequentially formed from an incident side surface to an InP substrate as described below. That is, the structure was formed of the $SiO_2$-based anti-reflection (AR) film 13/the p-electrode 7 and the diffusion mask 5/the InP window layer 4 (thickness d=1.5 µm), the Zn diffusion region (p-type region) 9, and the n-type GaInNAsP layer 3 (Si doped having a concentration n of $1\times10^{16}/cm^3$ and a thickness d of 1 µm; and P in a low concentration range of 0.01 to 1 atomic percent being added to GaInNAs)/the n-type InP buffer layer 2 (d=2 µm)/the n-type InP substrate 1 (S doped)/the n-electrode 6.

The above photodetector was formed by the following manufacturing method. On the S-doped InP substrate 1 having a size of 2-inch square, the n-type InP buffer layer 2 (d=2 µm), the GaInNAsP layer 3 doped with a small amount of Si (carrier concentration of $1\times10^{15}/cm^3$, and d=1 µm), and the non-doped InP window layer 4 (d=1.5 µm) were sequentially epitaxially grown by an organometal vapor phase epitaxy (OMVPE) method. The epitaxial growth temperature was set to 520° C. As raw materials, trimethylindium (TMIn), triethylgallium (TEGa), tertialbutylarsine (TBAs), tertialbutylphosphine (TBP), dimethylhydrazine (DMHy), and tetraethylsilane (TESi) were used.

As the InP substrate 1, an off-angled substrate was used which was inclined in the [111] direction with respect to the (100) plane by 13°. The lattice mismatch |(a1−a)/a| between a GaInNAsP absorption layer (lattice parameter a1) and an InP substrate (lattice parameter a) was 0.1% (0.001). A lattice mismatch of 0.2% or less could be always realized. At the stage when the InP buffer layer 2 and the GaInNAsP layer 3 were grown on the InP substrate 1, the growth was intermitted, and a photoluminescent (PL) spectrum was investigated.

Figure 19:
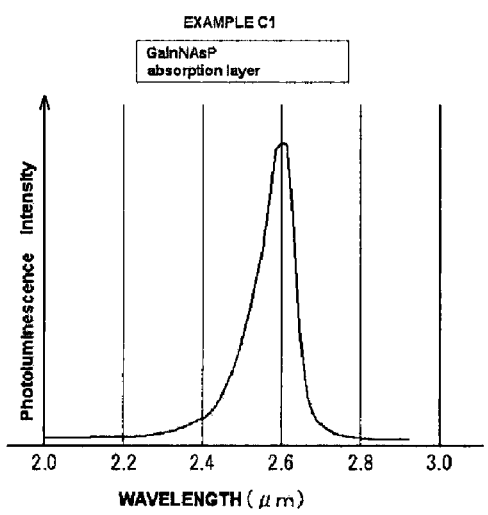
FIG. 19 is a view showing a PL spectrum according to Example C1 of the present invention.

The PL spectrum of the GaInNAsP layer is shown in FIG. 19. The horizontal axis indicates the wavelength (µm), and the vertical axis indicates the photoluminescent intensity (arbitrary scale). The photoluminescent intensity of the GaInNAsP layer was weak at a wavelength of 2.4 µm or less; however, it started to increase at a wavelength of approximately 2.45 µm, and a peak was obtained at a wavelength of 2.6 µm. From the PL spectrum, it was found that the bandgap of the GaInNAsP absorption layer was approximately 0.48 eV.

Based on the results described above, by the following method, a photodetector (photodiode shown in FIG. 4) for dark current and sensitivity (light quantum efficiency) measurement was formed. A wafer in which epitaxial layers were formed on the off-angled InP substrate 1 inclined in the [111] direction with respect to the (100) plane by 13°, that is, a wafer formed of the InP substrate 1, the InP buffer layer 2, the GaInNAsP absorption layer 3, and the InP window layer 4, was used, so that a PIN type photodiode was formed. In this process, the p-type region 9 was formed by selective diffusion of Zn to reach the inside of the GaInNAsP layer 3 using the SiN film 5 as a mask, so that the pn junction 15 was formed inside the GaInNAsP layer 3. Furthermore, the p-electrode 7, the n-electrode 6, the SiN diffusion mask 5, and the $SiO_2$-based AR film 13 were formed as shown in FIG. 4. In addition, since the n-type impurity concentration of the absorption layer was low, this layer was regarded as an intrinsic semiconductor (i-type semiconductor), and hence this photodiode was generally called a PIN-type photodiode. The photo diodes of the following Examples C2 and C3 of the present invention will also be called in the same manner as described above.

Example C2 of the Present Invention

The photodetector 10 having the structure shown in FIG. 4 was formed. In Example C2 of the present invention, GaInNAsP used as the absorption layer 3 of Example C1 of the present invention was changed to GaInNAsSb. An absorption diameter was set to 30 µm. The electrodes and the epitaxial layers were formed from the incident side surface to the InP substrate in the following order. That is, the structure was formed of the $SiO_2$-based anti-reflection (AR) film 13/the p-electrode 7 and the diffusion mask 5/the InP window layer 4 (thickness d=1.5 µm), the Zn diffusion region (p-type region) 9, and the n-type GaInNAsSb layer 3 (Si doped having a concentration n of $1\times10^{16}/cm^3$ and a thickness d of 1 µm; and Sb in a low concentration range of 0.1 to 10 atomic percent being added to GaInNAs)/the n-type InP buffer layer 2 (d=1 µm)/the n-type InP substrate 1 (S doped)/the n-electrode 6.

The above photodetector was formed by the following manufacturing method. On the S-doped InP substrate 1 having a size of 2-inch square, the n-type InP buffer layer 2 (d=1 µm), a non-doped GaInNAsSb layer (carrier concentration of $1\times10^{16}/cm^3$, and d=1 µm), and a non-doped InP window layer (d=1.5 µm) were sequentially epitaxially grown by a molecular beam epitaxy (MBE) method. The epitaxial growth temperature was set to 490° C.

Figure 20:
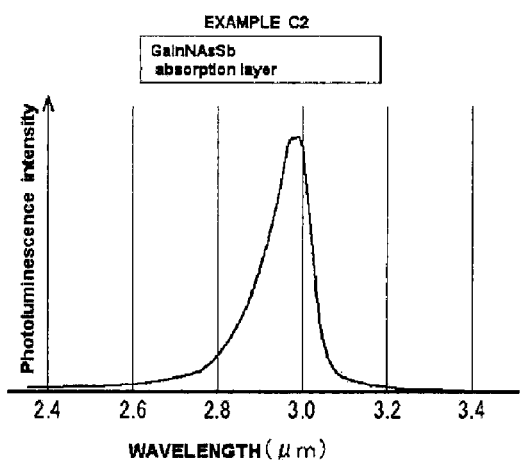
FIG. 20 is a view showing a PL spectrum according to Example C2 of the present invention.

As the InP substrate 1, an off-angled InP substrate was used which was inclined in the [1-11] direction with respect to the (100) plane by 15°. After the epitaxial layers including the above GaInNAsSb layer 3 were formed on this off-angled InP substrate 1, a photoluminescent (PL) spectrum was measured. The results are shown in FIG. 20. The horizontal axis indicates the wavelength (µm), and the vertical axis indicates the photoluminescent intensity (arbitrary scale). According to the results shown in FIG. 20, the PL intensity was weak to a wavelength of approximately 2.8 µm, was rapidly increased at a wavelength of approximately 2.86 µm, and had a peak at a wavelength of 2.95 µm. This peak value indicated that the bandgap wavelength of the absorption layer made of GaInNAsSb of this embodiment was 2.95 µm, that is, the bandgap was 0.42 eV.

Based on the experiment described above, by the following method, a photodetector (photodiode shown in FIG. 4) for dark current and sensitivity (light quantum efficiency) measurement was formed. A wafer in which epitaxial layers were formed on the off-angled InP substrate 1 inclined in the [111] direction with respect to the (100) plane by 13°, that is, a wafer formed of (the off-angled InP substrate 1/the InP buffer layer 2/the GaInNAsSb absorption layer 3/the InP window layer 4) was used, so that a PIN type photodiode was formed. In this process, the p-type region 9 was formed by selective diffusion of Zn to reach the inside of the n-type GaInNAsSb layer 3 using the SiN film 5 as a mask, so that the pn junction 15 was formed inside the GaInNAsSb layer 3. Furthermore, the p-electrode 7, the n-electrode 6, and the SiO$_2$-based AR film 13 were formed as shown in FIG. 4.

Example C3 of the Present Invention

A photodetector having the same structure as shown in FIG. 4 was formed in which a GaInNAs layer was used as the absorption layer 3. That is, although GaInNAsP and GaIn-NAsSb were used as the absorption layer 3 in Examples C1 and C2 of the present invention, respectively, in Example C3 of the present invention, GaInNAs was used as the absorption layer 3. The absorption diameter was set to 30 μm. The electrodes and the epitaxial layers were formed from the incident side surface to the InP substrate in the following order. That is, the structure was formed of the SiO$_2$-based anti-reflection (AR) film 13/the p-electrode 7 and the diffusion mask 5/the InP window layer 4 (thickness d=1.5 μm), the Zn diffusion region (p-type region) 9, and the n-type GaInNAs layer 3 (Si doped having a concentration n of $1 \times 10^{16}$/cm$^3$ and a thickness d of 1 μm; and an N concentration of 5 atomic percent in GaInNAs)/the n-type InP buffer layer 2 (d=1 μm)/the n-type InP substrate 1 (S doped)/the n-electrode 6.

The above photodetector was formed by the following manufacturing method. On a S-doped InP substrate having a size of 2-inch square, an n-type InP buffer layer (d=1 μm), a non-doped GaInNAs layer (carrier concentration of $1 \times 10^{16}$/cm$^3$, and d=1 μm), and a non-doped InP window layer (d=1.5 μm) were sequentially epitaxially grown by an MBE method. The epitaxial growth temperature was set to 490° C.

Figure 21:
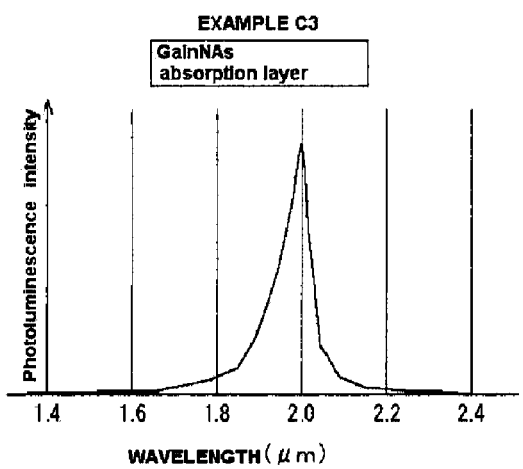
FIG. 21 is a view showing a PL spectrum according to Example C3 of the present invention.

As the InP substrate, an off-angled substrate was used which was inclined in the [1-11] direction with respect to the (100) plane by 15°. After the epitaxial layers including the above GaInNAs layer were formed on this off-angled InP substrate, a photoluminescent (PL) spectrum was measured. The results are shown in FIG. 21. The horizontal axis indicates the wavelength (μm), and the vertical axis indicates the photoluminescent intensity (arbitrary scale). According to the results shown in FIG. 21, the PL intensity was weak to a wavelength of approximately 1.8 μm, was rapidly increased at a wavelength of approximately 1.9 μm, and had a peak at a wavelength of 2.0 μm. This peak value indicated that the bandgap wavelength of the absorption layer made of GaIn-NAs of this embodiment was 2.0 μm, that is, the bandgap was 0.62 eV.

Based on the experiment described above, by the following method, a photodetector (photodiode shown in FIG. 4) for dark current and sensitivity (light quantum efficiency) measurement was formed. A wafer in which epitaxial layers were formed on the off-angled InP substrate 1 inclined in the [111] direction with respect to the (100) plane by 13°, that is, a wafer formed of (the off-angled InP substrate 1/the InP buffer layer 2/the GaInNAs absorption layer 3/the InP window layer 4) was used, so that a PIN type photodiode was formed. In this process, the p-type region 9 was formed by selective diffusion of Zn to reach the inside of the n-type GaInNAs layer 3 using the SiN film 5 as a mask, so that the pn junction 15 was formed inside the GaInNAs layer 3. Furthermore, the p-electrode 7, the n-electrode 6, and the SiO$_2$-based AR film 13 were formed as shown in FIG. 4.

Comparative Example A

Figure 24:
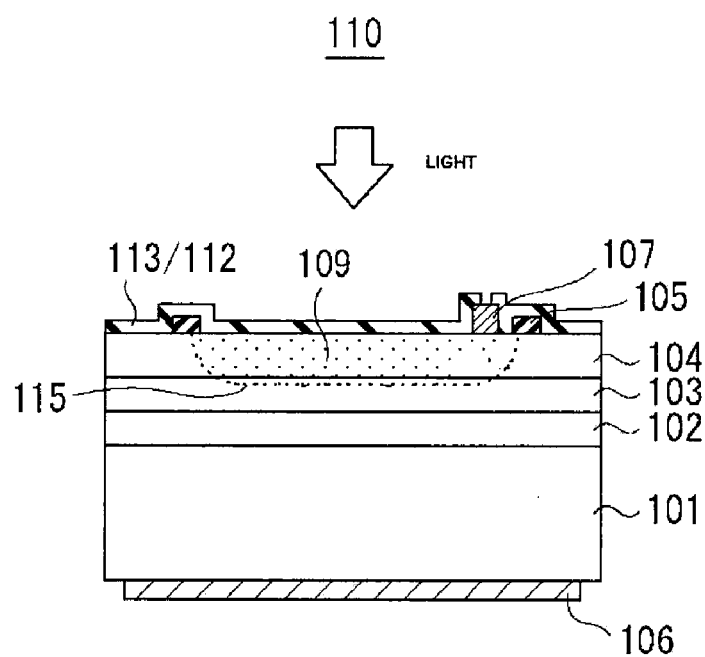
FIG. 24 is a view showing a related photodetector (Comparative Example A).

By a method similar to that of Examples C1 to C3 of the present invention, a photodetector 110 shown in FIG. 24 was formed. The photodetector 110 shown in FIG. 24 had the following structure. That is, the structure was formed of a SiO$_2$-based anti-reflection (AR) film 113/a SiN film 112/a p-electrode 107 and a diffusion mask 105/an InP window layer 104, a Zn diffusion region (p-type region) 109, and an n-type In$_{0.53}$Ga$_{0.47}$As layer 103/an n-type InP buffer layer 102/an n-type InP substrate 101/an n-electrode 106.

The only difference of Comparative Example A from Examples C1 to C3 of the present invention was that the n-type In$_{0.53}$Ga$_{0.47}$As layer 103 was used as a material for the absorption layer, and the other portions, such as the InP window layer 104, were not different from those of the examples of the present invention. The absorption diameter was also set to 30 μm which was the same as described above. Although not shown in the figure, a wavelength at a peak position of a PL spectrum of the absorption layer of Comparative Example A was 1.6 μm, and the bandgap was approximately 0.76 eV. Based on the results described above, as the cases of Examples C1 to C3 of the present invention, a photodiode for dark current and sensitivity (light quantum efficiency) measurement was formed.

Comparative Example B

A photodetector 110 shown in FIG. 25 was formed for Comparative Example B. The photodetector 110 shown in FIG. 25 had the following structure. That is, the structure was formed of a SiO$_2$-based anti-reflection (AR) film 113/an SiN film 112/a p-electrode 107 and a diffusion mask 105/an InAs$_{0.63}$P$_{0.37}$ window layer 104a, a Zn diffusion region (p-type region) 109, and an n-type In$_{0.8}$Ga$_{0.2}$As layer 103a/a graded composition InAsP buffer layer 102a/a n-type InP substrate 101/the n-electrode 106.

The step buffering layer (graded layer) 102a was provided on the InP substrate 101 so as to gradually increase the lattice parameter, and the In$_{0.8}$Ga$_{0.2}$As absorption layer 103a having a small bandgap was further provided. The graded composition InAsP buffer layer 102a was provided between the InP substrate 101 and the absorption layer 103a to reduce strain, and the absorption layer was formed to have an In$_{0.8}$Ga$_{0.2}$As composition (having a larger lattice parameter than that of InP and a smaller bandgap than that thereof). In addition, on this absorption layer, the InAs$_{0.63}$P$_{0.37}$ window layer which was lattice-matched with In$_{0.8}$Ga$_{0.2}$As was epitaxially grown. The graded composition InAsP buffer layer 102a was formed to have an InAs$_{0.63}$P$_{0.37}$ composition so as to have the same lattice parameter as that of In$_{0.8}$Ga$_{0.2}$As right under the absorption layer. Hence, the In$_{0.8}$Ga$_{0.2}$As absorption layer 103a was sandwiched with the InAs$_{0.63}$P$_{0.37}$ layers.

The graded composition InAsP buffer layer 102a was formed by an OMVPE method, was formed to increase the change in lattice parameter at an early stage, that is, at a position close to the InP substrate 101, in order to reduce the dark current, and was formed at a final stage, that is, at a position close to the absorption layer, to decrease the change in lattice parameter. The number of steps of the graded composition InAsP buffer layer 102a was set to 14, and the thickness of each step was set to approximately 0.1 to 0.4 μm. The methods for forming the other layers and the electrodes were the same as those of Examples C1 to C3 of the present invention. When the PL spectrum of the element thus formed was measured, the peak of the PL spectrum of the In$_{0.8}$Ga$_{0.2}$As absorption layer 103a was observed at a wavelength of 2.6 μm, that is, the bandgap was 0.48 eV.

1. Measurement Results of Dark Current

For the individual test samples prepared as described above, the dark current at room temperature (300K) and at an application voltage of 2V and the sensitivity (light quantum efficiency) were measured. The measurement results of the dark current are shown in the table together with the above bandgap wavelength of the absorption layer.

TABLE 1

| SAMPLE (PIN PHOTODIODE) | DARK CURRENT (@2 V, 300K) | BANDGAP WAVELENGTH OF THE ABSORPTION LAYER (μm) |
| --- | --- | --- |
| COMPARATIVE EXAMPLE A | 1 nA or less | 1.6 |
| COMPARATIVE EXAMPLE B | 20-30(μA) | 2.6 |
| EXAMPLE C1 (GaInNAsP) | 3 nA | 2.6 |
| EXAMPLE C2 (GaInNAsSb) | 2 nA | 2.95 |
| EXAMPLE C3 (GaInNAs) | 2 nA | 2.0 |

The dark currents of the test samples of Examples C1, C2, and C3 of the present invention and Comparative Example A were all several nanoampere or less, and hence, superior properties could be obtained. On the other hand, the dark current of Comparative Example B was 20 to 30 μA and was several thousands times larger that of Examples C1 to C3 of the present invention. A large difference in dark current as described above was caused by the difference in crystalline defect density of the epitaxial layer on the InP substrate. In the GaInNAsP absorption layer of Example C1, the GaInNAsSb absorption layer of Example C2, the GaInNAs absorption layer of Example C3, and the $In_{0.53}Ga_{0.47}As$ absorption layer of Comparative Example A, the degree of lattice mismatch was 0.15% ($|\Delta a/a|=0.0015$). Hence, an intermediate layer for lattice parameter adjustment, such as the graded layer, is not necessary, and in addition, an epitaxial layer having a low crystalline defect density can be formed.

On the other hand, according to the test sample of Comparative Example B, in order to decrease the bandgap, the In composition of InGaAs was increased to increase the lattice parameter; hence, by insertion of a graded buffer layer to reduce strain, the crystalline defect density was inevitably increased, and as a result, a large dark current as described above was generated. In addition, although the measurement of the dark current was performed only at room temperature, an image pickup device may be used under high temperature conditions in some cases, the temperature of which is considerably higher than room temperature. Under this high temperature conditions, parallel resistance of photodetectors is decreased, noises are increased, and the difference in dark current described above is further increased. The increase in difference of the dark current concomitant with the increase in temperature was confirmed by experiments carried out by the inventors of the present invention.

2. Measurement Results of Sensitivity (Wavelength-Light Quantum Efficiency)

Figure 22:
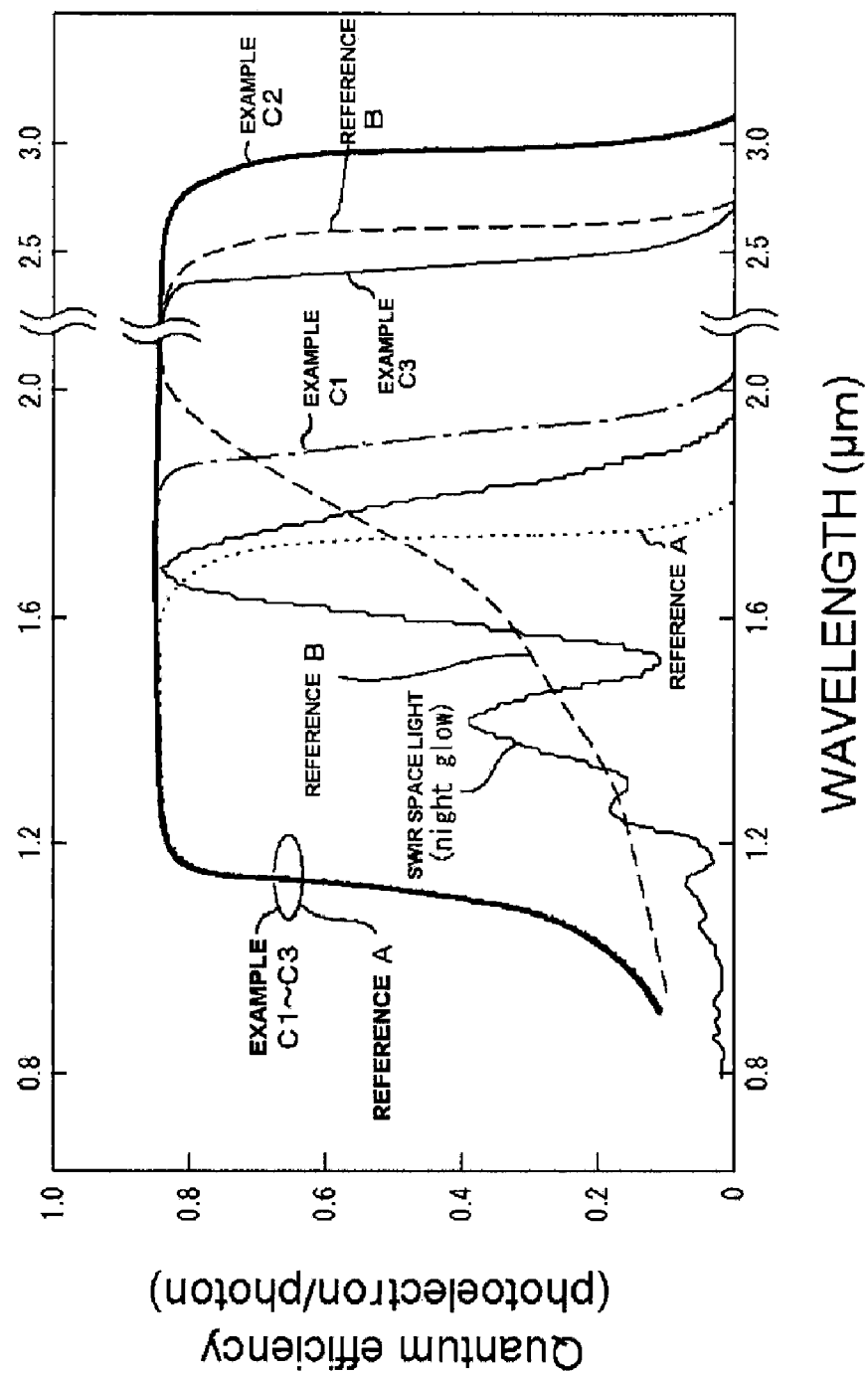
FIG. 22 is a view showing sensitivity measurement results of test samples of examples.

Next, evaluation results of the sensitivity of the individual photodetectors are shown in FIG. 22. In FIG. 22, a spectrum (arbitrary scale) of the SWIR band light coming from the universe is also shown. As apparent from FIG. 22, the photodetector of Comparative Example A had an absorption sensitivity only at a wavelength of up to 1.7 to 1.8 μm and could not absorb all the night glow in the SWIR band. The reason for this is that the $In_{0.53}Ga_{0.47}As$ layer lattice-matched with the InP substrate was used as the absorption layer. In addition, it has been well known that the $In_{0.53}Ga_{0.47}As$ layer had an absorption sensitivity only at a wavelength of up to 1.7 to 1.8 μm at a long wavelength side. Hence, it is believed that since the usable night glow in the SWIR band cannot all be absorbed, the image definition is degraded.

In addition, in the case of Comparative Example B, the photodetector had a sensitivity at a wavelength of up to 2.6 μm at a long wavelength side; however, in a short wavelength region at a wavelength of less than 2 μm, the sensitivity was considerably degraded. The reason for this is that since the $InAs_{0.63}P_{0.37}$ layer lattice-matched with $In_{0.8}Ga_{0.2}P$ (having a larger lattice parameter than that of InP) must be used as the window layer, absorption by the window layer causes degradation in sensitivity at a short wavelength side. Since $InAs_{0.63}P_{0.37}$ layers were provided at the p-electrode 107 side and the n-electrode 106 side so as to sandwich the absorption layer 103a, regardless of the epitaxial-side-up (see FIG. 4) and the epitaxial-side-down (see FIG. 5) structures, the degradation in sensitivity occurs in both cases. On the other hand, the photodetectors of Examples C1, C2, and C3 of the present invention have a high absorption sensitivity in all the range of the night glow in the SWIR band.

According to the results described above, it is understood that only the photodetectors of Examples C1, C2, and C3 of the present invention have a sufficiently small dark current and also have a sufficiently superior sensitivity to all the night glow spectrum in the SWIR band. When electric signals from the photodetectors are visualized, the ratio between the dark current and the light amount (absorption sensitivity) is significantly important for the dynamic range (S/N ratio) which determines the image definition. In Examples C1, C2, and C3 of the present invention, the ratio between the dark current and the absorption sensitivity is very small. Accordingly, as an image pickup device which can obtain a clear image, an image pickup device having an array of the photodetectors of Examples C1, C2, and C3 of the present invention can only be mentioned.

The reason for the difference in performance described above is that unlike the absorption layers of the comparative examples, the absorption layers of the photodetectors of Examples C1, C2, and C3 of the present invention are each formed of a quaternary or a quinary compound semiconductor. In the quaternary or the quinary compound semiconductor, by adjusting the compositions of the individual constituent elements to obtain lattice matching with InP, a decrease in bandgap (an increase in wavelength of absorbable light) can be realized. In addition, the reason the GaInNAsP, GaInNAsSb, and GaInNAs layers can be formed on the InP substrate to have a small defect density and to be practically used is primarily because of a large off angle of the substrate as described above. Without using the above off-angled InP substrate, a film of an N-containing InGaAs semiconductor having a practically usable crystal quality cannot be formed on the InP substrate.

Figure 23:
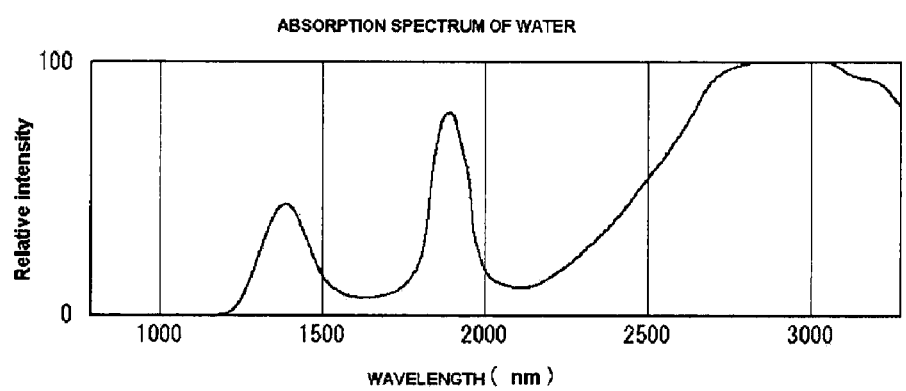
FIG. 23 is a view showing a water absorption spectrum.

In addition, the reason the maximum wavelength of the photodetector of the image pickup device of the present invention is set to 3.0 μm is that although the mechanism has not been understood as described above, when the maximum wavelength is further increased, the quality of the epitaxial film of the absorption layer is degraded, and as a result, a small dark current as shown in the table by way of example cannot be obtained. In addition, as can be understood from the water absorption spectrum shown in FIG. 23, with respect to a targeted absorption wavelength (~2.0 μm), a very large peak of the water absorption spectrum is present at an approximately 3.0 μm. That is, even when an absorbable wavelength is increased, the image definition cannot be further improved, and in addition, when an object is surrounded by water or is placed in fog, by increasing an absorption wavelength, the image definition may be conversely degraded in some cases. The water absorption spectrum is another reason why the maximum sensing wavelength of the photodetector of the present invention is set to 3.0 µm.

In the image pickup device of the present invention which absorbs the night glow and picks up an image, as long as the photodetector has sensitivity in the range of 1.0 to 3.0 µm as a maximum range and has no sensitivity at a longer and a shorter wavelength side of the above range, any material may be used for the photodetector. As described above, it is particularly important for the photodetector not to have sensitivity at a wavelength of more than 3.0 µm. In addition, the vision enhancement apparatus of the present invention was described with reference to the in-vehicle vision enhancement apparatus; however, besides the above application, the vision enhancement apparatus of the present invention may also be used, for example, for medical and living body recognition purposes.

Heretofore, although the embodiments and examples of the present invention have been described, they have been merely disclosed by way of example, and the present invention is not limited thereto. The scope of the present invention is disclosed in the following claims, and the equivalents to the claims and any changes within the scope thereof are to be included in the present invention.

Since the image pickup device and the vision enhancement apparatus, according to the present invention, can use the night glow in the SWIR band as a light source, can absorb the entire region thereof, and does not absorb light in an unnecessary wide band which may increase the dark current, the dark current and the number of dark spots can be reduced, a clear image can be picked up, and in addition, the installation space and the manufacturing cost can be effectively reduced. In addition, by using the InP substrate having a large off angle, a practically usable N-containing InGaAs-based compound semiconductor can be obtained, and in addition, an InP window layer can also be used; hence, superior sensitivity can be obtained in the entire night glow region, the dark current can be reduced to a lower level, and as a result, a clear image can be obtained.

What is claimed is:

1. An image pickup device which picks up an image of an object by absorbing light in a near infrared region reflected from the object, the image pickup device comprising semiconductor photodetectors which include an absorption layer having a bandgap wavelength in the range of 1.65 to 3.0 µm, wherein the semiconductor photodetectors further include an InP substrate, the absorption layer is formed on the InP substrate and includes a GaInNAsP layer, and the concentration of P of the GaInNAsP layer is in the range of 0.01 to 1 atomic percent.

2. An image pickup device which picks up an image of an object by absorbing light in a near infrared region reflected from the object, the image pickup device comprising semiconductor photodetectors which include an absorption layer having a bandgap wavelength in the range of 1.65 to 3.0 µm, wherein the semiconductor photodetectors further include an InP substrate, the absorption layer is formed on the InP substrate and includes a GaInNAsSb layer, and the concentration of Sb of the GaInNAsSb layer is in the range of 0.1 to 10 atomic percent.

3. An image pickup device which picks up an image of an object by absorbing light in a near infrared region reflected from the object, the image pickup device comprising semiconductor photodetectors which include an absorption layer having a bandgap wavelength in the range of 1.65 to 3.0 µm, wherein the semiconductor photodetectors further include an InP substrate, the absorption layer is formed on the InP substrate and includes a GaInNAs layer, and the concentration of N of the GaInNAs layer is in the range of 0.01 to 12 atomic percent.

4. The image pickup device according to claim 2, wherein the absorption layer is a crystalline layer having a lattice parameter which satisfies $|\Delta a/a| \leq 0.002$, where the lattice parameter of the InP substrate is represented by a, and the difference in lattice parameter between the crystalline layer forming the absorption layer and the InP substrate is represented by $\Delta a$.

5. The image pickup device according to claim 2, wherein the InP substrate is an off-angled substrate inclined in the [111] direction or the [11-1] direction with respect to the (100) plane by 5 to 20°.

6. The image pickup device according to claim 1, wherein the semiconductor photodetectors further include an InP window layer disposed so as to cover the absorption layer.

7. The image pickup device according to claim 1, wherein the semiconductor photodetectors absorb light in the wavelength range of 1.0 to 3.0 µm.

8. A vision enhancement device comprising: the image pickup apparatus according to claim 1.

9. A vision enhancement apparatus used for vision enhancement in a vehicle, comprising: image pickup means for picking up an image of a forward field of view of the vehicle; and display means for displaying the image picked up by the image pickup means, wherein the image pickup means comprises the image pickup device according to claim 1.

10. A vision enhancement apparatus used for vision enhancement in a vehicle, the vision enhancement apparatus comprising: image pickup means for picking up an image of a backward field of view of the vehicle; display means for displaying the image picked up by the image pickup means; and control means for performing control of drive of the image pickup means and that of the display means, wherein the image pickup means comprises the image pickup device according to claim 1.

11. A night-vision apparatus which is an optical device to visualize an object in the night, comprising the image pickup device according to claim 1.

12. A navigation supporting apparatus which is mounted in a vessel, the navigation supporting apparatus comprising an optical device to recognize an object including another vessel, wherein the optical device comprises the image pickup device according to claim 1.

13. A monitoring apparatus which is placed at a predetermined position, the monitoring apparatus comprising an optical device to monitor an object, wherein the optical device comprises the image pickup device according to claim 1.

14. The vision enhancement apparatus according to claim 8, wherein infrared light, near infrared light, and visible light irradiation means are not provided.

15. The night-vision apparatus according to claim 11, wherein infrared light, near infrared light, and visible light irradiation means are not provided.

16. The navigation supporting apparatus according to claim 12, wherein infrared light, near infrared light, and visible light irradiation means are not provided.

17. The monitoring apparatus according to claim 13, wherein infrared light, near infrared light, and visible light irradiation means are not provided.

* * * * *

UNITED STATES PATENT AND TRADEMARK OFFICE
CERTIFICATE OF CORRECTION

PATENT NO. : 7,608,825 B2 Page 1 of 1
APPLICATION NO. : 11/954617
DATED : October 27, 2009
INVENTOR(S) : Youichi Nagai, Yasuhiro Iguchi and Hiroshi Inada It is certified that error appears in the above-identified patent and that said Letters Patent is hereby corrected as shown below:

On the Title Page, Item (54), replace "SUPPORT" with --SUPPORTING--

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,608,825 B2  Page 1 of 1
APPLICATION NO. : 11/954617
DATED : October 27, 2009
INVENTOR(S) : Youichi Nagai, Yasuhiro Iguchi and Hiroshi Inada It is certified that error appears in the above-identified patent and that said Letters Patent is hereby corrected as shown below:

On the Title Page, Item (54) and at Column 1, line 4, in the title, replace "SUPPORT" with --SUPPORTING--

This certificate supersedes the Certificate of Correction issued January 12, 2010.

Signed and Sealed this

Second Day of February, 2010

David J. Kappos
*Director of the United States Patent and Trademark Office*